United States Patent
Thomas et al.

(10) Patent No.: US 9,920,432 B2
(45) Date of Patent: Mar. 20, 2018

(54) ADHESION PROMOTING AGENTS FOR METALLIZATION OF SUBSTRATE SURFACES

(71) Applicant: Atotech Deutschland GmbH, Berlin (DE)

(72) Inventors: Thomas Thomas, Berlin (DE); Lutz Brandt, Englewood, CO (US); Lutz Stamp, Berlin (DE); Hans-Jürgen Schreier, Velten (DE)

(73) Assignee: Atotech Deutschland GmbH, Berlin, DE (US)

( * ) Notice: Subject to any disclaimer, the term of this patent is extended or adjusted under 35 U.S.C. 154(b) by 413 days.

(21) Appl. No.: 14/362,604

(22) PCT Filed: Dec. 5, 2012

(86) PCT No.: PCT/EP2012/074433
§ 371 (c)(1),
(2) Date: Jun. 4, 2014

(87) PCT Pub. No.: WO2013/083600
PCT Pub. Date: Jun. 13, 2013

(65) Prior Publication Data
US 2014/0370313 A1    Dec. 18, 2014

(30) Foreign Application Priority Data
Dec. 5, 2011    (EP) .................................... 11191974

(51) Int. Cl.
*B05D 3/10*    (2006.01)
*C23C 28/00*    (2006.01)
(Continued)

(52) U.S. Cl.
CPC ............ *C23C 28/345* (2013.01); *B82Y 30/00* (2013.01); *C23C 18/165* (2013.01);
(Continued)

(58) Field of Classification Search
CPC ............ C23C 18/1844; C23C 18/1837; C23C 18/1824; C23C 18/1662
See application file for complete search history.

(56) References Cited

U.S. PATENT DOCUMENTS 8,076,264 B2    12/2011  Tsurumi et al.
2004/0112755 A1    6/2004  Czeczka et al.
(Continued)

FOREIGN PATENT DOCUMENTS

CN    1612951    5/2005
CN    101652247    2/2010
(Continued)

OTHER PUBLICATIONS

Xu et al., "Surface-Bound Nanoparticles for Initiating Metal Deposition," Thin Solid Films (no month, 2003), vol. 434, pp. 121-125.*
(Continued)

*Primary Examiner* — Dah-Wei D Yuan
*Assistant Examiner* — Nga Leung V Law
(74) *Attorney, Agent, or Firm* — Renner, Otto, Boisselle & Sklar, LLP

(57) ABSTRACT

A method is provided for metallization of substrates providing a high adhesion of the deposited metal to the substrate material and thereby forming a durable bond. The method applies novel adhesion promoting agents comprising nanometer-sized particles prior to metallization. The particles have at least one attachment group bearing a functional chemical group suitable for binding to the substrate.

22 Claims, 8 Drawing Sheets

(51) Int. Cl.
*C25D 5/54* (2006.01)
*C23C 18/20* (2006.01)
*C23C 18/18* (2006.01)
*B82Y 30/00* (2011.01)
*C23C 18/16* (2006.01)
*C25D 7/12* (2006.01)
*H05K 3/38* (2006.01)

(52) U.S. Cl.
CPC .......... *C23C 18/1653* (2013.01); *C23C 18/18* (2013.01); *C23C 18/1865* (2013.01); *C23C 18/1893* (2013.01); *C23C 18/2033* (2013.01); *C23C 18/2066* (2013.01); *C25D 5/54* (2013.01); *C25D 7/12* (2013.01); *H05K 3/389* (2013.01)

(56) References Cited

U.S. PATENT DOCUMENTS

| 2006/0032329 | A1* | 2/2006 | Rubinstein | B01D 67/0032 75/255 |
|---|---|---|---|---|
| 2006/0254502 | A1 | 11/2006 | Garrou et al. | |
| 2007/0023908 | A1 | 2/2007 | Fork et al. | |
| 2009/0042021 | A1 | 2/2009 | Kikuchi et al. | |
| 2009/0305226 | A1 | 12/2009 | Sinensky et al. | |
| 2010/0178512 | A1 | 7/2010 | Giesenberg et al. | |
| 2011/0002831 | A1 | 1/2011 | Arfsten et al. | |
| 2011/0197369 | A1 | 8/2011 | Hinestroza et al. | |
| 2011/0197782 | A1* | 8/2011 | Wang | B82Y 30/00 106/31.9 |
| 2011/0252580 | A1* | 10/2011 | Miller | D06M 11/42 8/190 |

FOREIGN PATENT DOCUMENTS

| JP | 2006-307084 | 11/2006 | | |
|---|---|---|---|---|
| WO | WO 2009129410 A1 | * | 10/2009 | .......... D06M 10/025 |

OTHER PUBLICATIONS

Search Report for corresponding Chinese Application No. 201280068380.1 dated Nov. 13, 2015 and it English translation.
Lehui Lu et al: "Selective Fabrication of Ordered Bimetallic Nanostructures with Hierarchical Porosity", Angewandte Chemie International Edition, vol. 44, No. 37, Sep. 19, 2005, pp. 5997-6001.
PCT/EP2012/074433; PCT International Search Report and Written Opinion of the International Searching Authority dated Feb. 25, 2014.
Lee et al.; "Selective Electroless Nickel Plating of Particle Arrays on Polyelectrolyte Multilayers"; Chem. Mater. vol. 15, No. 24; 2003; pp. 4583-4589.
Office Action for corresponding Japanese Application No. 2014-545226 dated Nov. 28, 2016.
Search Report for corresponding Taiwanese Application No. 101145723 dated Nov. 1, 2016 and it English translation.
Official Action for corresponding Chinese Application No. 201280068380.1 dated Dec. 15, 2016.

* cited by examiner

ADHESION PROMOTING AGENTS FOR METALLIZATION OF SUBSTRATE SURFACES

The present application is a U.S. National Stage Application based on and claiming benefit and priority under 35 U.S.C. § 371 of the International Application No. PCT/EP2012/074433, filed 5 Dec. 2012, which in turn claims benefit of and priority to European Application No. 11191974.2, filed 5 Dec. 2011, the entirety of each of which is hereby incorporated herein by reference.

FIELD OF THE INVENTION

The present invention relates to novel adhesion promoting agents comprising nanometer-sized particles for metallization of substrate surfaces. The present invention further relates to methods for plating a metal onto a substrate by applying the novel adhesion promoting agents as well as to the resulting metallized substrate.

BACKGROUND OF THE INVENTION

Various methods to metallize substrates are known in the art.

Conductive substrates can be directly plated with another metal by various wet chemical plating processes, e.g. electroplating or electroless plating. Such methods are well established in the art. Usually, after cleaning pretreatment is applied to the metal surface before the wet chemical plating process is applied to ensure a reliable plating result.

Various methods are known of coating non-conductive surfaces. In wet chemical methods, the surfaces to be metallised are, after an appropriate preliminary treatment, either firstly catalysed and then metallised in an electroless manner and thereafter, if necessary, metallised electrolytically, or are directly electrolytically metallised.

In EP 0 616 053 A1 there is disclosed a method for direct metallisation of non-conductive surfaces, in which the surfaces are firstly treated with a cleaner/conditioner solution, thereafter with an activator solution, for example a palladium colloidal solution, stabilised with tin compounds, and are then treated with a solution which contains compounds of a metal which is more noble than tin, as well as an alkali hydroxide and a complex former. Thereafter the surfaces can be treated in a solution containing a reducing agent, and can finally be electrolytically metallised.

WO 96/29452 concerns a process for the selective or partial electrolytic metallisation of surfaces of substrates made from electrically non-conducting materials which for the purpose of the coating process are secured to plastic-coated holding elements. The proposed process involves the following steps: a) preliminary treatment of the surfaces with an etching solution containing chromium (VI) oxide; followed immediately by b) treatment of the surfaces with a colloidal acidic solution of palladium-/tin compounds, care being taken to prevent prior contact with adsorption-promoting solutions; c) treatment of the surfaces with a solution containing a soluble metal compound capable of being reduced by tin (II) compounds, an alkali or alkaline earth metal hydroxide, and a complex forming agent for the metal in a quantity sufficient at least to prevent precipitation of metal hydroxides; d) treatment of the surfaces with an electrolytic metallisation solution.

Alternatively, conductive polymers can be formed on the non-conductive surface to provide a first conductive layer for subsequent metal plating of the surface.

US 2004/0112755 A1 describes direct electrolytic metallization of electrically non-conducting substrate surfaces comprising bringing the substrate surfaces into contact with a water-soluble polymer, e.g. a thiophene; treating the substrate surfaces with a permanganate solution; treating the substrate surfaces with an acidic aqueous solution or an acidic microemulsion of aqueous base containing at least one thiophene compound and at least one alkane sulfonic acid selected from the group comprising methane sulfonic acid, ethane sulfonic acid and ethane disulfonic acid; electrolytically metallizing the substrate surfaces.

U.S. Pat. No. 5,693,209 is directed to a process for directly metallizing a circuit board having nonconductor surfaces, includes reacting the nonconductor surface with an alkaline permanganate solution to form manganese dioxide chemically adsorbed on the nonconductor surface; forming an aqueous solution of a weak acid and of pyrrole or a pyrrole derivative and soluble oligomers thereof; contacting the aqueous solution containing the pyrrole monomer and its oligomers with the nonconductor surface having the manganese dioxide adsorbed chemically thereon to deposit an adherent, electrically conducting, insoluble polymer product on the nonconductor surface; and directly electrodepositing metal on the nonconductor surface having the insoluble adherent polymer product formed thereon. The oligomers are advantageously formed in aqueous solution containing 0.1 to 200 g/l of the pyrrole monomer at a temperature between room temperature and the freezing point of the solution.

Depending on the chemical nature of substrate surface, adhesion of the plated metal layer to said surface can be an issue. For example, adhesion can be too low to provide a reliable bond between the metal layer and the underlying substrate.

OBJECTIVE OF THE PRESENT INVENTION

It is therefore the objective of the present invention to provide a method for metallization of substrates providing a high adhesion of the deposited metal to the substrate material and thereby forming a durable bond.

Furthermore, it is the object of the present invention to be able to completely or selectively metallize a substrate surface.

SUMMARY OF THE INVENTION

These objects are solved by treating the substrate to be metallized with a solution containing nanometer-sized particles prior to metallization. The nanometer-sized particles have at least one attachment group bearing a functional chemical group suitable for binding to the substrate. Thus, a layer of the nanometer-sized particles is formed on at least a portion of the substrate surface.

The at least one attachment group has the general Formula (I)

$$-B-L-FG \qquad (I),$$

wherein B is a binding group, L is a linking group and FG is the functional chemical group.

The binding group B represents

1. $-Si(R^1R^2)-$, wherein $R^1$ and $R^2$ independently of each other represent alkoxy groups having from 1 to 12 carbon atoms, alkyl groups having from 1 to 12 carbon atoms, halogen atoms and a bond to oxygen atoms originating from the nanometer-sized particle and/or further attachment groups; or 2. —$CH_2$—$R^3$—, —CO—NH—, —CO—O—, unsubstituted or substituted aryl, wherein $R^3$ represents —CHOH—$CH_2$—O—, —CHOH—$CH_2$—; a linear, unsubstituted or substituted hydrocarbon group having from 1 to 5 carbon atoms.

The linking group L represents a linear, unsubstituted or substituted hydrocarbon group having from 1 to 20 carbon atoms; a cyclic, unsubstituted or substituted hydrocarbon group having from 3 to 8 carbon atoms; the linear or cyclic hydrocarbon group interrupted by one or more oxygen atoms and/or nitrogen atoms; the linear or cyclic hydrocarbon group having one or more double and/or triple bonds; unsubstituted or substituted aryl or heteroaryl, phosphonates and bipyridyl.

The functional chemical group FG represents an amino, carbonyl, carboxyl, ester, epoxy, mercapto, hydroxyl, acrylic, methacrylic, anhydride, acid halide, halogen, allyl, vinyl, styrene, aryl, acetylene, azide, ureido group; 5 to 6 membered heterocyclic hydrocarbon groups containing from 1 to 3 nitrogen atoms; isonicotinamidyl, bipyridyl, nitrile, isonitrile and thiocyanate.

Generally, the attachment group bearing a functional chemical group suitable for binding to the substrate is bound to the surface of the nanometer-sized particles chemically by forming a chemical bond or physically by adhesion forces.

The attachment groups bearing a functional chemical group suitable for binding to the substrate serve to create a bond between the particles and the substrate surface to be metallized. The bond can be both a chemical as well as a physical bond. A chemical bond generally is a covalent bond formed between the substrate material and at least one functional chemical group suitable for binding to the substrate of the attachment group. A physical bond generally is provided by adhesion forces between the substrate material and the attachment group bearing a functional chemical group suitable for binding to the substrate.

The nanometer-sized particles attached to the substrate surface render the surface susceptible to the subsequently plated metal layer and increase the adhesion between the metal and the substrate thereby providing a durable bond between the metal and the substrate surface. In addition, the nanometer-sized particles attached to the substrate surface increase the adsorption of activator to the substrate and thus, facilitate metallization.

The attachment group bearing a functional chemical group suitable for binding to the substrate can be any chemical entity suitable to bind chemically or physically to the substrate surface. A chemical bond between the attachment group and a functional group of the substrate surface is preferred since the bond strength is higher. Such chemical bond is for example formed by tempering the substrate after it has been brought into contact with the solution containing the nanometer-sized particles.

DETAILED DESCRIPTION OF THE INVENTION

The manufacture of nanometer-sized silica particles can be performed according to methods known in the art. The particles can also be purchased commercially, e.g. from Sigma-Aldrich. Also, the binding of the at least one attachment group to nanometer-sized silica particles is known in the art. The binding of the at least one attachment group to nanometer-sized particles is also called functionalization of the particles.

A suitable method to functionalize nanometer-sized silica particles is disclosed in the Examples section of the description. Such method is also suitable to functionalize nanometer-sized particles comprising reactive oxygen groups on their outer surface. Such method is particularly suitable to functionalize nanometer-sized oxide particles of alumina, titania, zirconia, tin oxide and zinc oxide.

The manufacture of the nanometer-sized silica particles can be performed e.g. by the process described by Stöber et al. (Stöber et al., Journal of Colloid and Interface Science 26, p. 62-69, 1968). Pure alcohol or alcohol mixtures (methanol, ethanol, propanol, butanol, pentanol), saturated alcoholic ammonia solution, ammonium hydroxide, and water are mixed. Ammonia is used as a catalyst causing the formation of spherical particles and additionally influences the size of the emerging particles. Subsequently a tetraalkyl silicate (alkyl=methyl, ethyl, propyl, butyl, pentyl) is added and the solution is agitated by shaking, ultrasonic vibration or magnetic stirring in order to keep the particles in suspension after they have formed. The solution is reacted for 15 minutes up to 20 hours at room temperature. The resulting silica particles are purified by washing.

Figure 1:
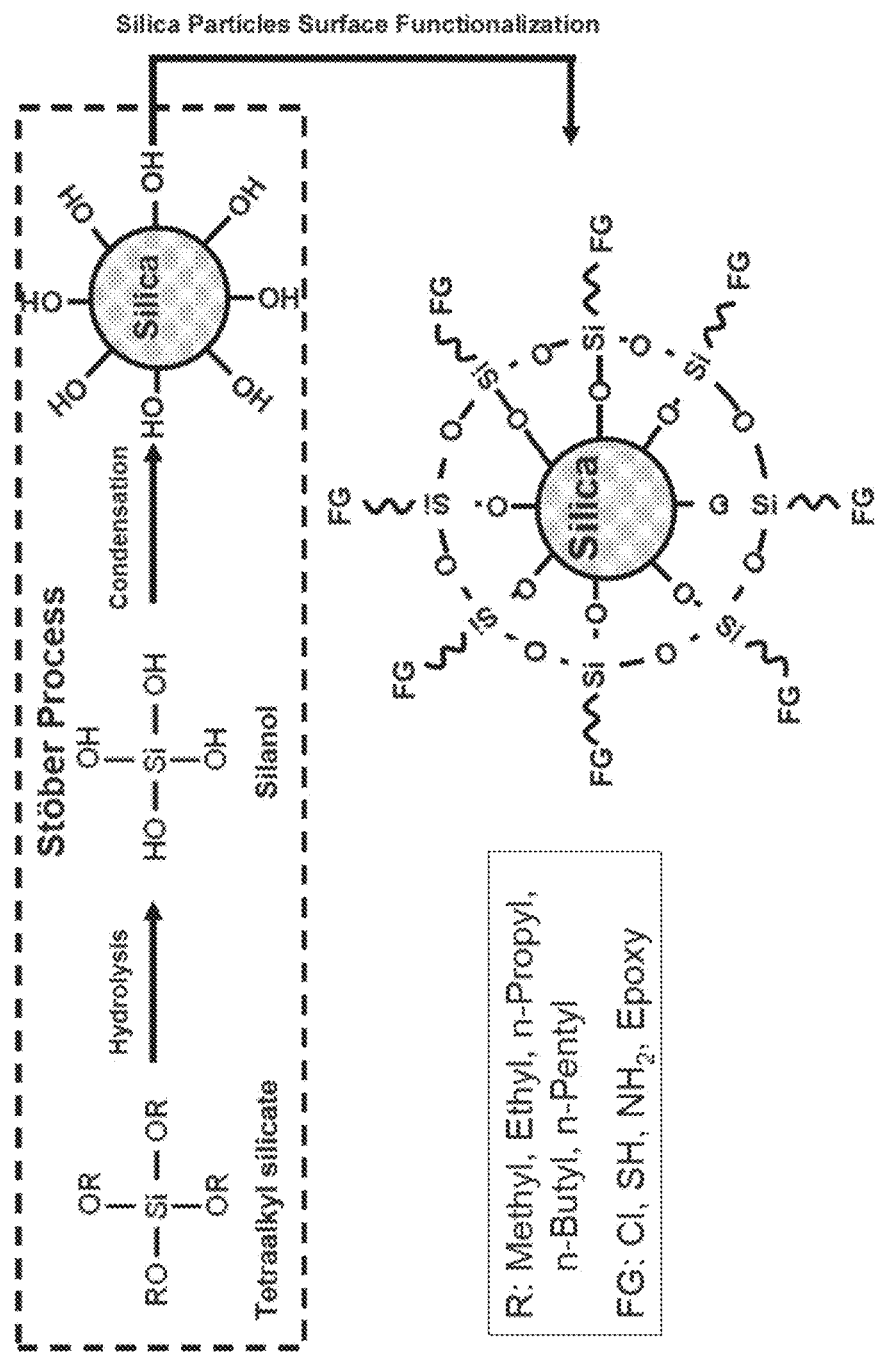
FIG. 1 describes the manufacturing scheme of nanometer-sized silica particles and the functionalization of the nanometer-sized silica particles by an attachment group. In this drawing in a first step a tetraalkyl silicate is used in order to prepare the nanometer-sized silica particles according to the Stöber process. In the second step the nanometer-sized silica particles are functionalized using a trialkoxysilane compound having a 3-FG-propyl group. FG represents the functional chemical group. The trialkoxysilane part of the silane compound contains the binding group B which binds to oxygen groups originating from the nanometer-sized oxide particle. The linking group L is e.g. a propyl group and the functional chemical group FG may be an amino group. L-FG is introduced by reacting the binding group B with the nanometer-sized silica particle.

The reaction is believed to consist of a hydrolysis step and a condensation step as shown in FIG. 1. During the hydrolysis step the alkoxy groups of the tetraalkyl silicate are hydrolysed to give the corresponding silanol. During the condensation step the hydroxy groups of different silanol molecules condensate and thus build up a silica structure.

The nanometer-sized oxide particles of alumina, titania, zirconia, tin oxide and zinc oxide of a preferred embodiment of the present invention can be manufactured by similar procedures. For example Park et al. present a method for the production of nanometer-sized alumina particles from $Al(OC_3H_7)_3$ (Park et al., Materials Research Bulletin 40, p. 1506-1512, 2005).

Zinc (II) oxide can be produced from metallic zinc or zinc ores by vaporisation in the presence of oxygen, or from zinc carbonates or zinc hydroxides by calcination. Zirconia can be fabricated from zirconium silicate by calcination.

In addition Peng et al. show the formation of nanometer-sized titania particles starting with $Ti(SO_4)_2$ (Peng et al., Journal of Physical Chemistry B 109, p. 4947-4952, 2005) and Taib & Sorrel present the synthesis of tin (IV) oxide particles from tin oxalate (Taib and Sorrel, J. Aust. Ceram. Soc. 43[1], p. 56-61, 2007).

The nanometer-sized oxide particles of silica, alumina, titania, zirconia, tin oxide and zinc oxide of a preferred embodiment of the present invention can also be purchased, for example from American Elements.

Characterization of nanometer-sized particles can be performed by dynamic light scattering (DLS). This method for determination of particle size distribution is known in the art. Determination of size of the silica particles of the present invention is described in the Example Section.

The nanometer-sized particles of the present invention may comprise only one material or may comprise more than one material.

The material the nanometer-sized particles comprise is selected from an inorganic oxide, an organic polymer and a metal.

The metal is selected from one or more of Ag, Au and Cu.

The inorganic oxide is selected from one or more of silica, alumina, titania, zirconia, tin oxide, zinc oxide, silica gel, silicon oxide-coated $TiO_2$, Sb—$SnO_2$, $Fe_2O_3$, magnetite, IndiumTinOxide (ITO), antimony-doped tin oxide (ATO), indium oxide, antimony oxide, fluorine-doped tin oxide, phosphorous-doped tin oxide, zinc antimonite and indium doped zinc oxide.

The organic polymer is selected from thermoplastic, elastomeric or crosslinked polymers. Examples of thermoplastic, elastomeric or crosslinked polymers are polymers of mono- and diolefins, e.g. polyethylene, polypropylene, polybutadiene; polystyrene, polyacrylate, polymethacrylate, halogen containing polymers, e.g. polyvinylchloride, polyvinylfluoride, polyvinylidene fluoride; polypyrrole, polyvinyl alcohol, polyvinyl acetate, polyalkylene glycols, polyethylene oxide, polyurethanes, polyamides, e.g. polyamide 4, polyamide 6; polyimides, polyesters, e.g. polyethylene terephthalate, polybutylene terephthalate; polycarbonates, polysulfones, polyethersulfones, epoxy resins, natural polymers, e.g. cellulose, cellulose acetates, cellulose ethers, gelatin, natural rubber; as well as mixtures, copolymers, block copolymers and graft polymers thereof.

In one preferred embodiment the nanometer-sized particles comprise only one material. In a more preferred embodiment the one material is the inorganic oxide defined above. Thus, in the more preferred embodiment the nanometer-sized oxide particles are nanometer-sized oxide particles. In the even more preferred embodiment the nanometer-sized oxide particles are selected from one or more of silica, alumina, titania, zirconia, tin oxide and zinc oxide particles.

In the most preferred embodiment the nanometer-sized oxide particles are silica particles.

In a further preferred embodiment the nanometer-sized particles comprise more than one material which means the nanometer-sized particles comprise a mixture of the materials defined above.

In a further preferred embodiment the nanometer-sized particles comprise more than one material which means the nanometer-sized particles comprise an inner core of one material, which is covered by an outer shell of another material. The outer shell comprises one or more layers of another material. The outer shell has an outermost layer also called an outer surface. The one material the core comprises is selected from the inorganic oxide, the organic polymer and the metal defined above. The another material the shell comprises is selected from the inorganic oxide, the organic polymer and the metal defined above. Within this preferred embodiment the one material the core comprises and the another material the shell comprises differ from each other. More preferred nanometer-sized particles comprising an inner core and an outer shell comprise for core/shell materials: polystyrene/polypyrrole; polystyrene/silica; zirconia/silica; gold/polypyrrole.

In an even more preferred embodiment the another material the outer surface of the shell comprises is the inorganic oxide. In the most preferred embodiment the inorganic oxide of the outer surface of the shell is selected from one or more of silica, alumina, titania, zirconia, tin oxide and zinc oxide. In the further most preferred embodiment the inorganic oxide of the outer surface of the shell is silica.

In a further more preferred embodiment the nanometer-sized particles have an outer surface which comprises the inorganic oxide. These nanometer-sized particles are called nanometer-sized oxide particles. The nanometer-sized oxide particles of this more preferred embodiment comprise only one material selected from the inorganic oxide. Alternatively the nanometer-sized oxide particles of this more preferred embodiment comprise a mixture of the inorganic oxides. Alternatively the nanometer-sized oxide particles comprise an inner core and an outer shell wherein the outer surface of the outer shell comprises the inorganic oxide. The core comprises the material selected from the inorganic oxide, the organic polymer and the metal. The inorganic oxide of the outer surface is as defined above. In the most preferred embodiment the inorganic oxide of the outer surface is selected from one or more of silica, alumina, titania, zirconia, tin oxide and zinc oxide. In the further most preferred embodiment the inorganic oxide of the outer surface is silica.

In a further preferred embodiment the nanometer-sized particles comprise reactive oxygen groups on their outer surface. If the outer surface of the nanometer-sized particles comprises the inorganic oxide, the reactive oxygen groups may be —OH, —OOH, —O$^-$, —OO$^-$. If the outer surface of the nanometer-sized particles comprises the organic polymer, the reactive oxygen groups may be —OH, —OOH, —O$^-$, —OO$^-$, —CHO, —CO—, —COOH, —COO$^-$, —COO—, —OCO— and —CON—.

Nanoparticles having a core-shell-structure are commercially available; for example particles with a core of zirconia and tin oxide and a shell of silica are available from Nissan Chemical Industry, Ltd. (High refractive index sol).

The nanometer-sized particles of the present invention have a mean diameter in a range of from 0.5 nm to 500 nm, preferably from 1 nm to 200 nm, more preferably from 10-100 nm and most preferably from 2 nm to 50 nm. The expression "mean diameter" is defined here as the $d_{50}$ value of the particle size distribution obtained by dynamic laser scattering measurement (number median of particle size distribution). The $d_{50}$ value of the particle size distribution means that 50% of the particles have a diameter below the given $d_{50}$ value. This method is equally applicable for all types of nano-sized-particles of the present invention.

The particles of the present invention have at least one attachment group bearing a functional chemical group suitable for binding to the substrate.

The at least one attachment group has the general Formula (I)

-B-L-FG    (I), wherein B is a binding group, L is a linking group and FG is a functional chemical group.

The binding group B represents
1. —Si($R^1R^2$)—, wherein $R^1$ and $R^2$ independently of each other represent alkoxy groups having from 1 to 12 carbon atoms, alkyl groups having from 1 to 12 carbon atoms, halogen atoms, and a bond to oxygen atoms originating from the nanometer-sized particle and/or further attachment groups; or
2. —$CH_2R^3$—, —CO—NH—, —CO—O—, unsubstituted or substituted aryl, wherein $R^3$ represents —CHOH—$CH_2$—O—, —CHOH—$CH_2$—; a linear, unsubstituted or substituted hydrocarbon group having from 1 to 5 carbon atoms.

The linking group L represents a linear, unsubstituted or substituted hydrocarbon group having from 1 to 20 carbon atoms; a cyclic, unsubstituted or substituted hydrocarbon group having from 3 to 8 carbon atoms; the linear or cyclic hydrocarbon group interrupted by one or more oxygen atoms and/or nitrogen atoms; the linear or cyclic hydrocarbon group having one or more double and/or triple bonds; unsubstituted or substituted aryl or heteroaryl, phosphonates, and bipyridyl.

The functional chemical group FG represents an amino, carbonyl, carboxyl, ester, epoxy, mercapto, hydroxyl, acrylic, methacrylic, anhydride, acid halide, halogen, allyl, vinyl, styrene, aryl, acetylene, azide, ureido group; 5 to 6 membered heterocyclic hydrocarbon groups containing from 1 to 3 nitrogen atoms; isonicotinamidyl, bipyridyl, nitrile, isonitrile, and thiocyanate.

The attachment group bearing a functional chemical group suitable for binding to the substrate is attached to the outer surface of the nanometer-sized particles or to the outer surface and the interior structure of the nanometer-sized particles. Preferably the attachment group bearing a functional chemical group suitable for binding to the substrate is attached to the outer surface of the nanometer-sized particles.

The nanometer-sized particles attached to the substrate surface render the surface susceptible to the subsequently plated metal layer and increase the adhesion between the metal and the substrate thereby providing a durable bond between the metal and the substrate surface.

The attachment group bearing a functional chemical group suitable for binding to the substrate can be any chemical entity suitable to bind chemically or physically to the substrate surface. The attachment group bearing a functional chemical group is preferably one or more of the above mentioned attachment groups. Attachment groups having a polymerizable group show only a low increase in adhesion between the metal and the substrate and are therefore less preferred. Polymerizable groups are epoxy, acrylic, methacrylic, allyl, vinyl, styrene and double bonds.

For the purposes of disclosure the following definitions apply:

"alkoxy" means an alkyl group ($R^4$) singly bonded to an oxygen atom, such like: $R^4$—O—. Preferred alkoxy groups are selected from —O—$CH_2$—$CH_3$, —O—$(CH_2)_2$—$CH_3$, —O—$(CH_2)_3$—$CH_3$, —O—$CH_2$—$(CH_3)_2$, —O—$(CH_2)_3$—$CH_3$, and —O—$(CH_2)_4$—$CH_3$.

"alkyl" ($R^4$) means any saturated monovalent radical hydrocarbon chain having general chemical Formula $C_nH_{2n+1}$, wherein n is an integer from 1 to 12, preferably an integer from 1 to 5, like methyl, ethyl, n-propyl, i-propyl, n-butyl, n-pentyl, and the like, most preferably methyl, ethyl or n-propyl. The alkyl groups may be unsubstituted or substituted and/or may be branched or unbranched. "branched" means that at least one hydrogen atom is displaced by an alkyl group.

"halogen" means chlorine, bromine, iodine, and fluorine atom.

"hydrocarbon group" means any saturated or unsaturated divalent radical hydrocarbon chain. The divalent saturated hydrocarbon chain, when being unsubstituted, has general chemical Formula $C_nH_{2n}$, wherein n is an integer from 1 to 20, preferably from 2 to 15 and more preferably from 2 to 5, such like methylene (—$CH_2$—), ethylene (—$CH_2$—$CH_2$—), n-propylene (—$CH_2$—$CH_2$—$CH_2$—), n-butylene (—$CH_2$—$CH_2$—$CH_2$—$CH_2$—), n-pentylene (—$CH_2$—$CH_2$—$CH_2$—$CH_2$—$CH_2$—). Divalent unsaturated hydrocarbon chains correspond to the definition of the divalent saturated hydrocarbon chain wherein at least two hydrogen atoms are displaced by an additional C—C bond to give at least one double bond or at least four hydrogen atoms are displaced by two additional C—C bonds to give at least one triple bond or both, such like —CH=CH—, —$CH_2$CH=CH—, —CH=CH—$CH_2$—, —$CH_2$CH=CH—$CH_2$—, —CH=CH—$CH_2$—$CH_2$—, —$CH_2$—$CH_2$—CH=CH—, and —CH=CH—CH=CH—. The hydrocarbon groups may be unsubstituted or substituted and/or may be branched or unbranched.

"linear hydrocarbon group" means a saturated or unsaturated divalent radical hydrocarbon chain as defined above which may be branched or unbranched. "branched" means that at least one hydrogen atom is displaced by an alkyl group. Branched linear hydrocarbon groups are for example —CH($CH_3$)—, —CH(—$CH_2$—$CH_3$)—, —CH(—$CH_2$—$CH_2$—$CH_3$)—, —CH($CH_3$)—$CH_2$—, —$CH_2$—CH($CH_3$)—, —CH(—$CH_2$—$CH_3$)—$CH_2$—, —$CH_2$—CH(—$CH_2$—$CH_3$)—, —CH(—$CH_2$—$CH_2$—$CH_3$)—$CH_2$—, —$CH_2$—CH(—$CH_2$—$CH_2$—$CH_3$)—, —CH($CH_3$)—$CH_2$—$CH_2$—, —$CH_2$—CH($CH_3$)—$CH_2$—, —$CH_2$—$CH_2$—CH($CH_3$)—, —CH($CH_3$)—$CH_2$—CH($CH_3$)—, —CH(—$CH_2$—$CH_3$)—$CH_2$—$CH_2$—, —$CH_2$—CH(—$CH_2$—$CH_3$)—$CH_2$—, —$CH_2$—$CH_2$—CH(—$CH_2$—$CH_3$)—, —CH(—$CH_2$—$CH_3$)—$CH_2$—CH(—$CH_2$—$CH_3$)—, —CH(—$CH_2$—$CH_2$—$CH_3$)—$CH_2$—$CH_2$—, —$CH_2$—CH(—$CH_2$—$CH_2$—$CH_3$)—$CH_2$—, and —$CH_2$—$CH_2$—CH(—$CH_2$—$CH_2$—$CH_3$)—. The linear hydrocarbon groups may be unsubstituted or substituted.

"cyclic hydrocarbon group" means a saturated or unsaturated divalent radical hydrocarbon chain the ends of which are bond to each other as to form a cyclic structure. The cyclic divalent saturated hydrocarbon group, when being unsubstituted, has general chemical Formula $C_nH_{2n-2}$, wherein n is an integer from 3 to 8, preferably from 3 to 6, such like cyclopropyl, cyclobutyl, cyclopentyl, cyclohexyl. Cyclic divalent unsaturated hydrocarbon groups correspond to the definition of the cyclic divalent saturated hydrocarbon group wherein at least two hydrogen atoms are displaced by an additional C—C bond to give at least one double bond; such like cyclopropenyl, cyclobutenyl, cyclobutadienyl, cyclopentenyl, cyclopentadienyl, cyclohexenyl, and cyclohexadienyl. The cyclic hydrocarbon groups may be unsubstituted or substituted and/or may be branched or unbranched.

"linear hydrocarbon group interrupted by one or more oxygen atoms and/or nitrogen atoms" means a linear hydrocarbon group as defined above, wherein 1 to 10 of not neighbouring methylene groups (—CH$_2$—) are displaced by —O—; and/or 1 to 10 of methylene groups are displaced by —NR$^5$—; and/or 1 to 10 of groups —CH═ are displaced by —N═, and wherein R$^5$ is selected from the group comprising hydrogen and alkyl; such like —O—CH$_2$—, —O—CO—CH$_2$—, —CH$_2$—O—CH$_2$—, —C$_2$H$_4$—O—C$_2$H$_4$—, —O—C$_2$H$_4$—O—C$_2$H$_4$—, —O—C$_2$H$_4$—O—, —O—CO—C$_2$H$_4$—O—C$_2$H$_4$—, —O—CO—C$_2$H$_4$—O—, —O—CO—C$_2$H$_4$, —C$_3$H$_6$—O—C$_3$H$_6$—, —O—C$_3$H$_6$—O—C$_3$H$_6$—, —O—C$_3$H$_6$—O—, —O—CO—C$_3$H$_6$—O—C$_3$H$_6$—, —O—CO—C$_3$H$_6$—O—, —O—CO—C$_3$H$_6$—, —CH$_2$—O—CH$_2$—O—CH$_2$—, —C$_2$H$_4$—O—C$_2$H$_4$—O—C$_2$H$_4$—, —C$_3$H$_6$—O—C$_3$H$_6$—O—C$_3$H$_6$—, —C$_2$H$_4$—O—C$_2$H$_4$—O—C$_2$H$_4$—O—C$_2$H$_4$—, —C$_3$H$_6$—O—C$_3$H$_6$—O—C$_3$H$_6$—, —NH—CH$_2$—, —NH—C$_2$H$_4$—, —NH—C$_3$H$_6$—, —NH—CO—CH$_2$—, —NH—CO—C$_2$H$_4$—, —NH—CO—C$_3$H$_6$—, —CH$_2$—NH—CH$_2$—, —NH—CH$_2$NH—CH$_2$—, —CH$_2$—NCH$_3$—CH$_2$—, —CH$_2$—NC$_2$H$_5$—CH$_2$—, —CH$_2$NC$_3$H$_7$—CH$_2$—, —C$_2$H$_4$—NH—C$_2$H$_4$—, —NH—C$_2$H$_4$—NH—C$_2$H$_4$—, —NH—CO—C$_2$H$_4$—NH—C$_2$H$_4$—, —C$_2$H$_4$—NCH$_3$—C$_2$H$_4$—, C$_2$H$_4$C$_2$H$_5$C$_2$H$_4$, —C$_2$H$_4$—NC$_3$H$_7$—C$_2$H$_4$—, —C$_3$H$_6$—NH—C$_3$H$_6$—, —NH—C$_3$H$_6$—NH—C$_3$H$_6$—, —NH—CO—C$_3$H$_6$—NH—C$_3$H$_6$—, —C$_3$H$_6$—NCH$_3$—C$_3$H$_6$—, —C$_3$H$_6$—NC$_2$H$_5$—C$_3$H$_6$—, —C$_3$H$_6$—NC$_3$H$_7$—C$_3$H$_6$—, —CH$_2$—NH—CH$_2$—O—CH$_2$—, —CH$_2$—O—CH$_2$—NH—CH$_2$—, —CH$_2$—NH—CH$_2$—NH—CH$_2$—, CH$_2$NCH$_3$CH$_2$—O—CH$_2$—, —CH$_2$—O—CH$_2$—NCH$_3$—CH$_2$—, —CH$_2$—NCH$_3$—CH$_2$—NCH$_3$—CH$_2$—, and —CH$_2$—NH—CH$_2$—NCH$_3$—CH$_2$—. The linear hydrocarbon groups interrupted by one or more oxygen atoms and/or nitrogen atoms may be unsubstituted or substituted and/or may be branched or unbranched.

"cyclic hydrocarbon group interrupted by one or more oxygen atoms and/or nitrogen atoms" means a cyclic hydrocarbon group as defined above, wherein 1 to 4 of not neighbouring methylene groups (—CH$_2$—) are displaced by —O—; and/or 1 to 4 of methylene groups are displaced by —NR$^5$—; and/or 1 to 4 of groups —CH═ are displaced by —N═, and wherein R$^5$ is selected from the group comprising hydrogen and alkyl; such like oxirane, aziridine, azetidine, diazetidine, oxazetidine, oxetane, dioxetane, tetrahydrofuran, dioxolane, oxazolidine, dioxazolidine, pyrrolidine, imidazolidine, oxadiazolidine, piperidine, hexahydropyrimidine, triazinane, oxazinane, dioxazinane, oxadiazinane, tetrahydropyran, dioxane, trioxane, oxirene, azirine, dihydro-azete, dihydro-diazete, diazete, oxazete, oxete, dihydro-furane, dioxole, dihydro-oxazole, dioxazole, dihydro-pyrrole, dihydro-imidazole, dihydro-oxadiazole, oxadiazole, tetrahydro-pyridine, dihydro-pyridine, tetrahydro-pyrimidine, dihydro-pyrimidine, tetrahydro-triazine, dihydro-triazine, dihydro-oxazine, oxazine, dioxazine, dihydro-oxadiazine, oxadiazine, dihydro-pyran, pyran, dioxine, oxazole, pyrrole, and furan. The cyclic hydrocarbon groups interrupted by one or more oxygen atoms and/or nitrogen atoms may be unsubstituted or substituted and/or may be branched or unbranched.

"aryl" means an aromatic hydrocarbon group having from 5 to 12 carbon atoms which may be substituted or unsubstituted and/or may be branched or unbranched and/or may be monovalent or divalent, such like phenyl, naphthyl, diphenyl, benzyl. Most preferably aryl is phenyl or benzyl.

"heteroaryl" means an aromatic moiety having 5 to 6 ring members and having as the ring members, in addition to carbon atoms, from 1 to 3 nitrogen atoms. Heteroaryl moieties may be unsubstituted or substituted and/or may be branched or unbranched and/or may be monovalent or divalent. Most preferably heteroaryl is pyridyl, pyridazinyl, pyrimidinyl, pyrazinyl, triazinyl, pyrrolyl, pyrazoyl, imidazoyl, triazoyl, and the like.

"phosphonate" means an organic derivative of phosphonic acid having general chemical Formula —R$^6$—PO(OR$^{7-}$)(OR$^8$), wherein R$^6$ to R$^7$ are independently selected from the group comprising a linear hydrocarbon group and aryl; and wherein R$^8$ is selected from the group comprising hydrogen, alkyl, aminoalkyl and aryl; such like —CH$_2$—PO(OCH$_2$—)(OH), —CH$_2$—PO(OCH$_2$—)(OCH$_3$), —C$_2$H$_4$—PO(OCH$_2$—)(OH), —C$_2$H$_4$—PO(OCH$_2$—)(OC$_2$H$_5$), —C$_2$H$_4$—PO(OC$_2$H$_4$—)(OH), —C$_2$H$_4$—PO(OC$_2$H$_4$—)(OC$_2$H$_4$), —CH(NH$_2$)—PO(OCH$_2$—)(OH), —CH(NH—CH$_3$)—PO(OCH$_2$—)(OCH$_3$), —CHN(CH$_3$)$_2$—PO(OCH$_2$—)(OCH$_3$), —CH(NH$_2$)CH$_2$—PO(OCH$_2$—)(OH), —CH$_2$CH(NH$_2$)—PO(OCH$_2$—)(OH), —CH(NH$_2$)CH$_2$—PO(OCH$_2$—)(OC$_2$H$_5$), —CH$_2$CH(NH$_2$)—PO(OCH$_2$—)(OC$_2$H$_5$), —CH(NH$_2$)CH$_2$—PO(OC$_2$H$_4$—)(OH), —CH(NH$_2$)CH$_2$—PO(OC$_2$H$_4$—)(OH), —CH(NH$_2$)CH$_2$—PO(OC$_2$H$_4$—)(OC$_2$H$_4$), and —CH$_2$CH(NH$_2$)—PO(OC$_2$H$_4$—)(OC$_2$H$_4$).

"amino" means the moiety NR$^9$R$^{10}$, wherein R$^9$ and R$^{10}$ are independently selected from the group comprising hydrogen and alkyl, such like —NH$_2$, —NH—CH$_3$, —NH—CH$_2$—CH$_3$, —NH—CH$_2$—CH$_2$—CH$_3$, —N(CH$_3$)$_2$, —N(CH$_3$)—CH$_2$—CH$_3$, —N(CH$_3$)—CH$_2$—CH$_2$—CH$_3$, —N(C$_2$H$_5$)$_2$, —N(C$_2$H$_5$)—CH$_2$—CH$_2$—CH$_3$, and —N(C$_3$H$_7$)$_2$.

"aminoalkyl" means an alkyl group as defined above substituted with one or more amino groups as defined above. Preferred aminoalkyl groups are selected from —CH$_2$—NH$_2$, —(CH$_2$)$_2$—NH$_2$, —(CH$_2$)$_3$—NH$_2$, —(CH$_2$)$_4$—NH$_2$, and —(CH$_2$)$_5$—NH$_2$.

"ester" means the moiety —CO—OR$^{11}$, wherein R$^{11}$ is selected from the group comprising alkyl, such like —CO—OCH$_3$, —CO—OCH$_2$—CH$_3$, —CO—OCH$_2$—CH$_2$—CH$_3$, —CO—OCH$_2$—CH$_2$—CH$_2$—CH$_3$, and —CO—OCH$_2$—CH$_2$—CH$_2$—CH$_3$.

"epoxy" means the moiety having general chemical Formula

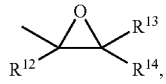

wherein R$^{12}$ to R$^{14}$ are independently selected from the group comprising hydrogen, alkyl, hydroxyalkyl and aryl, such like

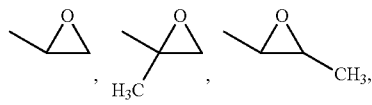

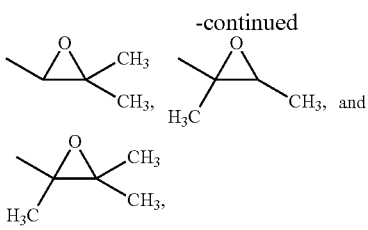

"hydroxyalkyl" means an alkyl group as defined above substituted with one or more hydroxy groups; such like —CH$_2$—OH, —CH(OH)—CH$_3$, —CH$_2$—CH$_2$—OH, —CH(OH)—CH$_2$—OH, —CH(OH)—CH$_2$—CH$_3$, —CH$_2$—CH(OH)—CH$_3$, —CH$_2$—CH$_2$—CH$_2$—OH, —CH(OH)—CH$_2$—CH$_2$—OH, —CH$_2$—CH(OH)—CH$_2$—OH, —CH(OH)—CH$_2$—CH$_2$—CH$_3$, —CH$_2$—CH(OH)—CH$_2$—CH$_3$, —CH$_2$—CH$_2$CH(OH)—CH$_3$, and —CH$_2$—CH$_2$—CH$_2$—CH$_2$—OH. The hydroxyalkyl groups may be branched or unbranched.

"mercapto" means the moiety —S—R$^{15}$, wherein R$^{15}$ is selected from the group comprising hydrogen and alkyl; such like —S—H, —S—CH$_3$, —S—CH$_2$—CH$_3$, —S—CH$_2$—CH$_2$—CH$_3$, —S—CH$_2$—CH$_2$—CH$_2$—CH$_3$, and —S—CH$_2$—CH$_2$—CH$_2$—CH$_2$—CH$_3$.

"acetylene" means —C≡CH, —C≡C—CH$_3$, —C≡C—CH$_2$—CH$_3$, and —C≡C—(CH$_2$)—CH$_3$.

"acrylic" means the moiety —CO—CR$^{16}$=CR$^{17}$R$^{18}$, wherein R$^{16}$ to R$^{18}$ are independently selected from the group comprising hydrogen, alkyl and aryl such like —CO—CH=CH$_2$, —CO—C(CH$_3$)=CH$_2$, —CO—CH=CH—CH$_3$, —CO—CH=C(CH$_3$)$_2$, —CO—C(CH$_3$)=C(CH$_3$)$_2$, —CO—C(CH$_3$)=CH—CH$_3$, and —CO—CH=CH—C$_6$H$_5$.

"methacrylic" means the moiety —CO—CR$^{16}$=CR$^{17}$R$^{18}$, wherein R$^{16}$ is —CH$_3$ and R$^{17}$ to R$^{18}$ are as defined above.

"anhydride" means the moiety —CO—O—CO—R$^{19}$, wherein R$^{19}$ is selected from the group comprising hydrogen and alkyl; such like —CO—O—CO—H, —CO—O—CO—CH$_3$, —CO—O—CO—CH$_2$—CH$_3$, —CO—O—CO—CH$_2$—CH$_2$—CH$_3$, —CO—O—CO—CH$_2$—CH$_2$—CH$_2$—CH$_3$, and —CO—O—CO—CH$_2$—CH$_2$—CH$_2$—CH$_3$.

"allyl" means the moiety —CR$^{20}$R$^{21}$—CR$^{22}$=CR$^{23}$R$^{24}$, wherein R$^{20}$ to R$^{24}$ are independently selected from the group comprising hydrogen, alkyl and aryl; such like —CH$_2$—CH=CH$_2$, —CH$_2$—C(CH$_3$)=CH$_2$, —CH$_2$—CH=CH—CH$_3$, —CH$_2$—CH=C(CH$_3$)$_2$, —CH$_2$—C(CH$_3$)=C(CH$_3$)$_2$, —CH$_2$—CH=CH—C$_6$H$_5$, —CH$_2$—C(C$_2$H$_5$)=CH$_2$, and —CH$_2$—CH=CH—C$_2$H$_5$.

"vinyl" means the moiety —CR$^{25}$=CR$^{26}$R$^{27}$, wherein R$^{25}$ to R$^{27}$ are independently selected from the group comprising hydrogen, alkyl and aryl; such like —CH=CH$_2$, —C(CH$_3$)=CH$_2$, —CH=CH—CH$_3$, —CH=C(CH$_3$)$_2$, —C(CH$_3$)=C(CH$_3$)$_2$, —CH=CH—C$_6$H$_5$, —C(CH$_3$)=CH—C$_6$H$_5$, —CH=C(CH$_3$)—C$_6$H$_5$, —C(C$_2$H$_5$)=CH$_2$, —CH=CH—C$_2$H$_5$, —CH=C(C$_2$H$_5$)$_2$, —C(C$_2$H$_5$)=C(C$_2$H$_5$)$_2$, —C(C$_2$H$_5$)=CH—C$_6$H$_5$, and —CH=C(C$_2$H$_5$)—C$_6$H$_5$.

"styrene" means the moiety —CR$^{25}$=CR$^{26}$R$^{27}$, wherein R$^{26}$ is phenyl and R$^{25}$ and R$^{27}$ are as defined above. The phenyl group may be unsubstituted or substituted.

"carbonyl" means the moiety —CO—R$^{25}$, wherein R$^{25}$ is selected from the group comprising hydrogen, alkyl and aryl; such like —COH, —CO—CH$_3$, —CO—CH$_2$—CH$_3$, —CO—CH$_2$—CH$_2$—CH$_3$, and —CO—C$_6$H$_5$. "acid halide" means the moiety —CO—R$^{25}$, wherein R$^{25}$ is selected from the group comprising chloride and bromide, such like —CO—Cl, and —CO—Br.

"heterocyclic" means a monovalent or divalent cyclic moiety having 5 to 6 ring members and having as the ring members, in addition to carbon atoms, from 1 to 3 nitrogen atoms. Heterocyclic moieties may be unsubstituted or substituted and/or may be branched or unbranched. Most preferably a heterocyclic hydrocarbon group is pyrrolidinyl, imidazolidinyl, pyrazolidinyl, triazolidinyl, piperidinyl, hexahydropyridazinyl, hexahydropyrimidinyl, piperazinyl, triazinanyl, pyridyl, pyridazinyl, pyrimidinyl, pyrazinyl, triazinyl, pyrrolyl, pyrazoyl, imidazoyl, triazoyl, and the like.

"ureido" means the moiety —NR$^{28}$—CO—NR$^{29}$R$^{30}$, wherein R$^{28}$ to R$^{30}$ are independently selected from the group comprising hydrogen, alkyl and aryl; such like —NH—CO—NH$_2$, —N(CH$_3$)—CO—NH$_2$, —NH—CO—NH(CH$_3$), —NH—CO—NH(CH$_3$)$_2$, —N(CH$_3$)—CO—NH(CH$_3$), —N(CH$_3$)—CO—NH(CH$_3$)$_2$, —NH—CO—NH—C$_6$H$_5$, —N(CH$_3$)—CO—NH—C$_6$H$_5$, —NH—CO—N(CH$_3$)—C$_6$H$_5$, —N(C$_2$H$_5$)—CO—NH$_2$, —NH—CO—NH(C$_2$H$_5$), —NH—CO—NH(C$_2$H$_5$)$_2$, —N(C$_2$H$_5$)—CO—NH(C$_2$H$_5$), —N(C$_2$H$_5$)—CO—NH(C$_2$H$_5$)$_2$, —N(C$_2$H$_5$)—CO—NH—C$_6$H$_5$, —NH—CO—N(C$_2$H$_5$)—C$_6$H$_5$.

"substituted" means that at least one hydrogen atom in an organic moiety is substituted by a substituent selected from hydroxyl, carbonyl, carboxyl, ester, anhydride, acid halide, epoxy, amino, nitrile, isonitrile, thiocyanate, halogen, mercapto, acrylic, methacrylic, allyl, vinyl, styrene, aryl, acetylene, azide, ureido group; 5 to 6 membered heterocyclic hydrocarbon groups containing from 1 to 3 nitrogen atoms; isonicotinamidyl, and bipyridyl. The mentioned substituents are as defined above.

Preferred attachments groups are selected from —SiR$^1$R$^2$—(CH$_2$)$_3$—NH$_2$, —SiR$^1$R$^2$—(CH$_2$)$_3$—SH, —SiR$^1$R$^2$—(CH$_2$)$_3$—OH, —SiR$^1$R$^2$—(CH$_2$)$_3$—COOH, —SiR$^1$R$^2$—(CH$_2$)$_3$—COCl, —SiR$^1$R$^2$—(CH$_2$)$_3$—CN, —SiR$^1$R$^2$—(CH$_2$)$_3$—SCN, —SiR$^1$R$^2$—(CH$_2$)$_3$—Cl, —SiR$^1$R$^2$—(CH$_2$)$_3$—CH=CH$_2$, —SiR$^1$R$^2$—(CH$_2$)$_3$—C≡CH, —SiR$^1$R$^2$—(CH$_2$)$_3$—C$_6$H$_5$, —SiR$^1$R$^2$—(CH$_2$)$_3$—N$_3$, —SiR$^1$R$^2$—(CH$_2$)$_3$—CO—CH=CH$_2$, —SiR$^1$R$^2$—(CH$_2$)$_3$—CO—C(CH$_3$)=CH$_2$, —(CH$_2$)$_4$—NH$_2$, —(CH$_2$)$_4$—SH, —(CH$_2$)$_4$—OH, —(CH$_2$)$_4$—(CH$_2$)$_4$—COOH, —(CH$_2$)$_4$—COCl, —(CH$_2$)$_4$—CN, —(CH$_2$)$_4$—SCN, —(CH$_2$)$_4$—(CH$_2$)$_4$—Cl, —(CH$_2$)$_4$—(CH$_2$)$_4$—CH=CH$_2$, —(CH$_2$)$_4$—C≡CH, —(CH$_2$)$_4$—C$_6$H$_5$, —(CH$_2$)$_4$—N$_3$, —(CH$_2$)$_4$—CO—CH=CH$_2$, —(CH$_2$)$_4$—CO—C(CH$_3$)=CH$_2$, —CH$_2$—CHOH—CH$_2$—O—(CH$_2$)$_3$—NH$_2$, —CH$_2$—CHOH—CH$_2$—O—(CH$_2$)$_3$—SH, —CH$_2$—CHOH—CH$_2$—O—(CH$_2$)$_3$—OH, —CH$_2$—CHOH—CH$_2$—O—(CH$_2$)$_3$—COOH, —CH$_2$—CHOH—CH$_2$—O—(CH$_2$)$_3$—COCl, —CH$_2$—CHOH—CH$_2$—O—(CH$_2$)$_3$—CN, —CH$_2$—CHOH—CH$_2$—O—(CH$_2$)$_3$—SCN, —CH$_2$—CHOH—CH$_2$—O—(CH$_2$)$_3$—Cl, —CH$_2$—CHOH—CH$_2$—O—(CH$_2$)$_3$—CH=CH$_2$, —CH$_2$—CHOH—CH$_2$—O—(CH$_2$)$_3$—C≡CH, —CH$_2$—CHOH—CH$_2$—O—(CH$_2$)$_3$—C$_6$H$_5$, —CH$_2$—CHOH—CH$_2$—O—(CH$_2$)$_3$—N$_3$, —CH$_2$—CHOH—CH$_2$—O—(CH$_2$)$_3$—CO—CH=CH$_2$, —CH$_2$—CHOH—CH$_2$—O—(CH$_2$)$_3$—CO—C(CH$_3$)=CH$_2$, —CH$_2$—C$_6$H$_4$—(CH$_2$)$_3$—NH$_2$, —CH$_2$—C$_6$H$_4$—(CH$_2$)$_3$—SH, —CH$_2$—C$_6$H$_4$—(CH$_2$)$_3$—OH, —CH$_2$—C$_6$H$_4$—(CH$_2$)$_3$—COOH, —CH$_2$—C$_6$H$_4$—(CH$_2$)$_3$—COCl, —CH$_2$—C$_6$H$_4$—(CH$_2$)$_3$—CN, —CH$_2$—C$_6$H$_4$—(CH$_2$)$_3$—SCN, —CH$_2$—C$_6$H$_4$—(CH$_2$)$_3$—Cl, —CH$_2$—C$_6$H$_4$—(CH$_2$)$_3$—CH=CH$_2$, —CH$_2$—C$_6$H$_4$—(CH$_2$)$_3$—C≡CH, —CH$_2$—C$_6$H$_4$—(CH$_2$)$_3$—C$_6$H$_5$, —CH$_2$—C$_6$H$_4$—(CH$_2$)$_3$—N$_3$, —CH$_2$—C$_6$H$_4$—(CH$_2$)$_3$—

—CO—CH=CH$_2$, —CH$_2$—C$_6$H$_4$—(CH$_2$)$_3$—CO—C(CH$_3$)=CH$_2$, —CO—NH—(CH$_2$)$_3$—NH$_2$, —CO—NH—(CH$_2$)$_3$—SH, —CO—NH—(CH$_2$)$_3$—OH, —CO—NH—(CH$_2$)$_3$—COOH, —CO—NH—(CH$_2$)$_3$—COCl, —CO—NH—(CH$_2$)$_3$—CN, —CO—NH—(CH$_2$)$_3$—SCN, —CO—NH—(CH$_2$)$_3$—Cl, —CO—NH—(CH$_2$)$_3$—CH=CH$_2$, —CO—NH—(CH$_2$)$_3$—C≡CH, —CO—NH—(CH$_2$)$_3$—C$_6$H$_5$, —CO—NH—(CH$_2$)$_3$—N$_3$, —CO—NH—(CH$_2$)$_3$—CO—CH=CH$_2$, and —CO—NH—(CH$_2$)$_3$—CO—C(CH$_3$)=CH$_2$,

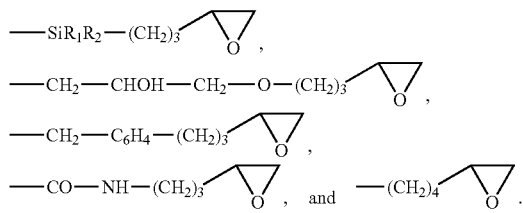

R$^1$ and R$^2$ are as defined above.

By at least one attachment group it is meant that attachment groups with different linking groups L and/or different functional chemical groups FG can be bound to the same nanometer-sized particle. For example, the linking group L of a first attachment group can be an alkyl group and the linking group L of a second attachment group can be an aryl group bound to the same nanometer-sized particle. For example, the functional chemical group FG of a first attachment group can be a thiol group and the functional chemical group FG of a second attachment group can be an amino group, both attachment groups bound to the same nanometer-sized particle. The functional chemical group FG suitable for binding to the substrate can be any functionality which forms a bond to the respective substrate. Preferably the functional chemical group FG is as defined above.

Generally, the attachment group bearing a functional chemical group suitable for binding to the substrate is bound to the surface of the nanometer-sized particles chemically by forming a chemical bond or physically by adhesion forces.

In accordance with a preferred embodiment of the present invention, the at least one attachment group is bound to nanometer-sized silica particles as shown in FIG. 1. This means, that a chemical (covalent) bond is formed between the binding group B of the attachment group according to Formula (I) and a reactive center on the silica surface of the particle. As an example the reaction of (3-aminopropyl) triethoxysilane with a silica particle is discussed. Such reaction is believed to be a condensation reaction at the silica particle's surface which normally has, due to hydrolysis, Si—OH groups which are exposed at the surface thereof. Such condensation reaction of a silane compound, in this example (3-aminopropyl) triethoxysilane, with the silica particle's surface Si—OH groups may be as follows:

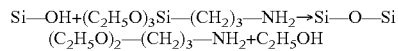

It is believed that further reaction steps may take place at further surface Si—OH groups as follows:

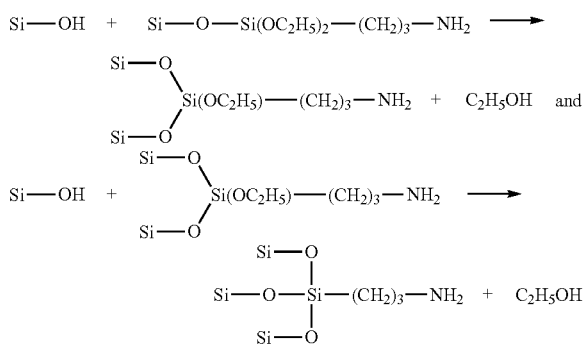

The further surface Si—OH groups may stem from the silica particle or may stem from further attachment groups that reacted in the nearest vicinity of the attachment group in focus onto the silica's particle surface. Thus, the trialkoxy silicon moiety of the silane compound may create an additional layer of a silica structure on the surface of the silica particle, while the organic functional group also being part of the silane compound builds the outer layer of the silica particle. A simple model of this structure generated by reaction of a silane compound with a silica particle is presented in FIG. 1. This model is presented in order to facilitate understanding of the functionalization step by using silane compounds. The real structure generated by reaction of a silane compound with a silica particle might be more diverse and complicated than the simple model is able to describe. Halogen atoms instead of alkoxy groups in the silane compound react in a similar way. The formation of an additional layer of a silica structure from silane compounds is also possible on the surface of nanometer-sized particles comprising reactive oxygen groups on their outer surface. The formation of an additional layer of a silica structure from silane compounds is in particular possible on the surface of nanometer-sized oxide particles of alumina, titania, zirconia, tin oxide and zinc oxide of a preferred embodiment of the present invention.

The silica particles having at least one attachment group bearing a functional chemical group suitable for binding to the substrate can be produced by reacting the silica particles with a trialkoxy silane compound bearing an organic functional group according to the process described by Choi and Chen (Choi & Chen, Journal of Colloid and Interface Science 258, p. 435-437, 2003). The mentioned silane compound or compounds are added to the silica particles dispersed in a solvent, like water, ethanol, chloroform, hexane, dimethyl formamide or acetyl acetate. The resulting dispersion is stirred at room temperature for at least one hour in order to obtain good mixing between silica particles and the silane compound. The dispersed silica particles are adjusted to pH 3 to 6 with an organic acid prior to adding the silane compound. This step prevents a side reaction of the silane compounds, like hydrolysis and condensation. The dispersion is refluxed at higher temperatures for at least 3 hours. The reacted dispersion is then washed three times by dialysis, centrifugation or filtration in order to remove non reacted silane compound.

Alternatively, the silica particles and the silane compound are mixed in a non-aqueous solvent, like acetone or chloroform, and left to react the reaction mixture for a short time period, one hour for example. Then a precipitate formed in the reaction mixture can be separated. Alternatively, a silane compound is mixed with an acid in an aqueous medium. Then silica particles are dispersed in this reaction mixture, while preferably stirring the reaction mixture. More elaborate and diverse embodiments and examples of preparing the silica particles modified by bonding one or a plurality of different aminosilanes to the surface thereof are disclosed in EP 1 894 888 A1, wherein the type of diverse silica sources and types, the solvent used to react the silica particles with the aminosilanes, the acid used in the reaction mixture as well as the pH prevailing during the reaction step, the type of aminosilane compounds ($R_aSiX_{(4-a)}$), herein one or a plurality of such aminosilanes are used to be bonded to the silica particles' surface, the concentration and ratio of concentrations of silica and aminosilanes, the operations for reacting the silica particles with the aminosilanes (mixing, stirring), the concentration of the silica particles suspended in the reaction mixture, and the like from EP 1 894 888 A1 are referred to be incorporated into the description of the present application.

The nanometer sized oxide particles of alumina, titania, zirconia, tin oxide and zinc oxide of a preferred embodiment of the present invention having at least one attachment group bearing a functional chemical group suitable for binding to the substrate can be produced in a way analogous to the functionalized silica particles as described above. Lesniak et al. present for example an analogous functionalization of iron oxide particles with organo silanes (U.S. Pat. No. 6,183,658).

Further silane compounds bearing an organic functional group that have combinations of alkyl groups and halogen atoms and/or alkoxy groups instead of alkoxy groups only were reported by Radhakrishnan et al. for functionalization of silica particles (Radhakrishnan et al., Soft Matter, 2006, 2, p. 386-396). Using these silane compounds various organic functional groups were introduced to the particle's surfaces which could further be modified to bind polymers.

Park et al. reviewed a number of different silane reagents for functionalization of silica particles (Park et al., Chem. Commun., 2011, 47, 4860-4871), like silazanes, allylsilanes, methallylsilanes, arylsilanes and vinylsilanes. The reaction of these silanes with the silanol groups of the silica particles results in a covalent bond between the oxygen originating from the silanol groups and the silicon of the silane reagent. Using these silane reagents various organic functional groups were introduced to the particle's surfaces. The organic functional groups could further be modified in order to bind polymers or biomolecules.

In addition to silane compounds reagents not containing silicon moieties were developed for functionalization of silica particles. Organic compounds bearing an organic functional group and containing isocyanato groups or oxirane groups are also reactive to silanol groups of silica particles according to Liu et al. (Liu et al., Journal of Colloid and Interface Science 336, 2009, 189-194, and Liu et al., Nanotechnology 14, 2003, 813-819). The reaction of these organic compounds with the silica particles results in a covalent bond between the oxygen originating from the silanol groups and a carbon atom originating from the isocyanato group or oxirane group. Various organic functional groups were introduced to the particle's surfaces. The organic functional groups could also be modified in order to bind polymers.

A multiple step and thus more elaborate strategy for functionalizing silica particles starts with replacing the silanol groups with chlorine atoms (see Locke et al., Analytical Chemistry, Vol. 44, No. 1, 1972, 90-92). The activated particle surface can be modified with aryl or alkyl moieties by Grignard reaction or Wurtz reaction creating a covalent bond between the silicon of the silica particle and a carbon atom of the aryl or alkyl moiety. The aryl or alkyl moieties can be further modified by reactions known in the field of organic synthetic chemistry in order to bear organic functional groups.

All of the above described functionalizations relate to already existing particles and belong therefore to the group of post modification of particles. It is also possible to generate functionalized particles by so called in situ modification or co-condensation. These methods simultaneously generate particles and functionalize it. Functionalized silica particles for example can be synthesized by reacting tetraethoxysilane (TEOS) in the presence of a trialkoxysilane bearing an organic functional group. Thus, silica particles are created that already have organic functional groups attached to their outer surface and within their interior structure. The trialkoxysilane bearing an organic functional group may be (3-aminopropyl)triethoxysilane, (3-mercapto propyl) trimethoxy-silane, phenyltrimethoxysilane, vinyltriethoxysilane, and (3-cyano-ethyl)triethoxy silane according to Rahman et al. and Naka et al. (Rahman et al., Ceramics International 35, 2009, 1883-1888, and Naka et al., Colloids and Surfaces A: Physicochem. Eng. Aspects 361, 2010, 162-168). In contrast, particles functionalized by post modification have organic functional groups attached to their outer surface, solely.

All functionalities of particles initially introduced by in situ modification or post modification can be further modified by reactions known in the field of organic synthetic chemistry in order to create the desired organic functional groups.

Characterization of the functionalization of nanometer-sized particles can be performed by Fourier Transform Infra Red—Attenuated Total Reflectance (FTIR-ATR) spectroscopy and Nuclear Magnetic Resonance (NMR) spectroscopy. These methods for characterizing surface functionalities of nanometer-sized particles are known to the persons skilled in the art. Characterization of the surface functionalities of silica particles of the present invention is described in the Example Section. These methods are equally applicable for other types of nanosized-particles, e.g. alumina, titania, zirconia, tin oxide and zinc oxide particles, a preferred embodiment of the present invention.

The attachment groups bearing a functional chemical group suitable for binding to the substrate serve to create a bond between the particles and the substrate surface to be metallized. The bond can be both a chemical as well as a physical bond. A chemical bond generally is a covalent bond formed between the substrate material and at least one functional chemical group suitable for binding to the substrate of the attachment group. The bond between the particles and the substrate surface can as well be an ionic bond. A physical bond generally is provided by adhesion forces between the substrate material and the attachment group bearing a functional chemical group suitable for binding to the substrate. A physical bond can be based on the formation of hydrogen bridges, on van der Waals interactions or dispersion forces.

Various kinds of substrates can be metallized with a method according to the present invention. The substrates to be metallized can be selected from the group comprised of electrical non-conductive substrates, electrical conductive substrates, and electrical semi-conductive substrates.

The method according to the present invention is particularly suitable to metallize electrical non-conductive substrates or surfaces.

The electrical non-conductive substrates to be metallized can be selected from the group comprising glass, ceramics, and plastics.

Plastics can be selected from the group comprising acrylonitrile-butadiene-styrol-copolymer (ABS copolymer); polyamide; a mixture of an ABS copolymer and at least one other polymer which is different to the ABS copolymer; polycarbonate (PC); ABS/PC blends; epoxy resin; bismaleimide-triazine resin (BT); cyanate ester resin; polyimide; polyethylene terephthalate (PET); polybutylene terephthalate (PBT); polylactic acid (PLA); polypropylene (PP); and polyester.

The method of the present invention for plating a metal onto a substrate comprises the steps of
  i. contacting the substrate with a solution containing nanometer-sized particles having at least one attachment group bearing a functional chemical group suitable for binding to the substrate, thereby forming a layer of said nanometer-sized particles on at least a portion of the substrate surface; and thereafter
  ii. metal plate the substrate applying a wet-chemical plating method,
  and wherein the layer of said nanometer-sized particles remain between the substrate surface and the plated metal.

Thus, the nanometer-sized particles form a layer between the substrate surface and the plated metal. In other words, the layer of nanometer-sized particles stays on the substrate surface even after depositing a metal layer. The layer of nanometer-sized particles is not removed from the substrate surface, neither prior to nor after depositing a metal layer.

Preferably in the method of the present invention the plated metal remains on the layer of said nanometer-sized particles. Thus, the plated metal forms a layer on the nanometer-sized particles. The layer of plated metal stays on the nanometer-sized particles and on the substrate surface. The layer of plated metal is not removed from the layer of said nanometer-sized particles and the substrate surface.

The method steps of the present invention are performed according to the given order but do not necessarily have to be performed directly one after another. Additional steps may be performed between the said method steps.

For step ii. several methods for plating a metal onto a substrate by applying a wet-chemical plating method are known to the person skilled in the art. According to the present invention the wet chemical plating method preferably is an electrolytic plating method, an immersion plating process or an electroless plating method.

When plating a metal to a non-conductive substrate according to above described process, an activation step needs to be applied either before step i) or step ii) in order to render the substrate surface sufficiently conductive for the metal plating step.

Non-conductive substrates, e.g. plastic objects can then be metallized after activation by using an electroless metallising method or alternatively by using a direct plating method (electrolytic plating method). The object is first cleaned and etched in both methods followed by application of e.g. a noble metal or conductive polymer and then finally metallised.

A typically activation of non-conductive substrates for subsequent metal plating is performed as follows:

The etching is normally undertaken using chromic acid/sulfuric acid. Etching solutions made on the basis of organic solvents or an alkaline or acid permanganate solution can be used as an alternative for certain plastics. The etching serves to make the surface of the object more accommodating for the subsequent metallisation so that the surfaces of the objects can be wetted well with the respective solutions in the following treatment steps and the deposited metal is adequately firmly bound to the surface. To etch the surface made out of acrylonitrile-butadiene-styrol-copolymer (ABS copolymer), it is etched using chromic acid/sulfuric acid in such a way that surface microcaverns are formed in which metal precipitates and subsequently firmly adheres to the surface there.

In addition to etching a cleaning step may be performed. For cleaning an alkaline cleaner may be used. Suitable alkaline cleaners are known in the art.

Once the etching and optional cleaning is completed an activation step is performed. The plastic is activated for electroless metallisation using an activator which contains a noble metal and then electrolessly metallised. A thicker metal layer can then also be applied electrolytically afterwards. In the case of the direct plating method that gets by without using electroless metallisation, the etched surface is usually treated with a palladium colloid solution and then with an alkaline solution which contains copper ions forming a complex with a complexing agent. Thereafter the object can then be electrolytically metallised directly (EP 1 054 081 B1).

In an alternative embodiment for a direct plating method according to U.S. Pat. No. 4,590,115, a plastic object is manufactured which contains small electrically non-conductive oxide particles of a non-noble metal, for example copper, in the polymer. The oxide particles exposed on the surface of the object are reduced to a metal using a reducing agent such as a boron hydride. The object can then be coated electrolytically with metal immediately afterwards or at a later point in time. This document indicates a copper(I) oxide containing object being put in a water bath to be cleaned by the action of ultrasound. The copper(I) oxide in the object is then subsequently reduced to copper using sodium borohydride so that electrolytic copper can be deposited later on the surface of the object.

Compared to the conventional methods in which the objects
  A) are first etched or cleaned with an etching or cleaning solution;
  B) are then treated with a solution of a colloid or with a compound, particularly a salt of a metal of Group VIIIB or IB of the Periodic Table of the Elements (noble metal), particularly a palladium/tin colloid; and
  C) are finally metallised electrolytically using a metallising solution,
within the method of the present invention the plastic objects or the substrates are additionally subjected to a treatment in a further method step, being preferably carried out between method steps A) and B) which corresponds to step i. as defined above. Alternatively step i. may be carried out between method steps B) and C). This treatment greatly enhances the adhesion between the substrate and the subsequently applied metal layer. It is an advantage of the present invention that by applying method step i. to the substrate often harsh etching treatment in toxic solutions in step A) can be avoided and still very good adhesion is obtained.

The nanometer-sized particles according to method step i. are selected from the nanometer-sized particles comprising only one material or comprising more than one material. In a preferred embodiment the nanometer-sized particles according to method step i. are selected from the group of nanometer-sized oxide particles comprising one or more of silica, alumina, titania, zirconia, tin oxide and zinc oxide particles.

The nanometer-sized particles according to method step i. are functionalized by having at least one attachment group bearing a functional chemical group suitable for binding to the substrate as described above. Thus, a layer of the nanometer-sized particles is formed on the substrate surface. A layer of nanometer-sized particles on the substrate surface can be a monolayer of particles. A monolayer is a single, closely packed layer of particles. A monolayer can also be described as particles in an arrangement of a densest sphere packing in a two dimensional space. A layer of nanometer-sized particles on the substrate surface can also be a partial monolayer. A partial monolayer is a single layer of particles packed in a less dense arrangement leaving more space between the individual particles than in a densest sphere packing. A layer of nanometer-sized particles on the substrate surface can also be a stack of several layers of particles. The stack contains at least 2 layers of particles. The stack of layers may have a structure of a densest sphere packing in a three dimensional space or may have a structure of less dense packing.

The nanometer-sized particles according to method step i. are in a concentration ranging from 0.5 g/l to 100.0 g/l, preferred in a range from 2.5 g/l to 75.0 g/l, more preferred in a range from 2.5 g/l to 50.0 g/l, and most preferred in a range from 2.5 g/l to 20.0 g/l. The nanometer-sized particles are suspended in a solution in a concentration that is easy to handle physically or that is suited to create at least a monolayer of the particles on the surface of the substrate.

Figure 6A:
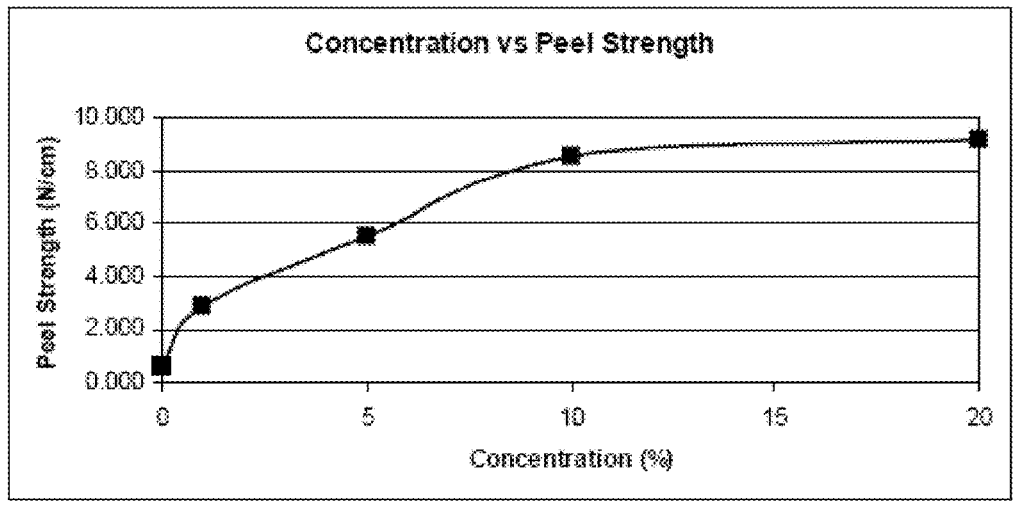
FIG. 6 shows the influence on adhesion strength of various parameters when applying the functionalized silica nanoparticles for metallization of a dielectric substrate.

FIG. 6A shows the influence of the concentration of functionalized silica particles on the adhesion strength between a dielectric substrate and a copper layer. The silica particles were applied to the dielectric substrate as described in Example 6. If no silica particles are applied to the dielectric substrate, the adhesion strength is about 0.6 N/cm, which is only a low adhesion of the copper layer to the substrate. For increasing concentrations of functionalized silica particles applied to the dielectric substrate an increasing adhesion is observed between substrate and copper layer. A maximum of about 9 N/cm is achieved which is an outstanding and excellent adhesion strength.

The solution containing nanometer-sized particles according to method step i. further comprises a solvent selected from alcohols, ketones and water. Examples of solvents are methanol, ethanol, propanol, butanol or acetone. Preferred solvents are selected from ethanol, n-propanol, i-propanol, acetone and water.

Contacting the plastic objects or the substrates with a solution containing nanometer-sized particles according to method step i. is performed by dipping or immersing the plastic objects or the substrates into said solution; or by spraying or pipetting the solution to the plastic objects or the substrates. Contacting the plastic objects or the substrates with a solution containing nanometer-sized particles according to method step i. is performed at least once. Alternatively said contacting can be performed several times, preferably between 1 to 20 times, more preferred between 1 to 10, even more preferred between 1 to 5 times, and most preferred between once to twice.

Contacting the plastic objects or the substrates with a solution containing nanometer-sized particles according to method step i. is performed for a time period ranging from 1 to 20 minutes, preferred from 3 to 10 minutes, most preferred from 5 to 7 minutes.

Contacting the plastic objects or the substrates with a solution containing nanometer-sized particles according to method step i. is performed at a temperature ranging from 15 to 80° C., preferred from 20 to 40° C., most preferred from 23 to 30° C.

The solution containing one or more nanometer-sized particles generally is a colloid.

In a preferred embodiment of the present invention a further method step is performed after method step i.:
ia. heating the plastic objects or the substrates to an elevated temperature.

This further method step is also called tempering. The elevated temperature according to method step ia. depends on the substrate material. The elevated temperature ranges from 60 to 400° C., preferred from 60 to 200° C., more preferred from 100 to 150° C., most preferred from 120 to 140° C. Glass or ceramics substrates, electrical conductive substrates or electrical semi-conductive substrates may be heated up to 400° C. while substrates made of plastics may be heated up to 200° C.

Figure 6B:
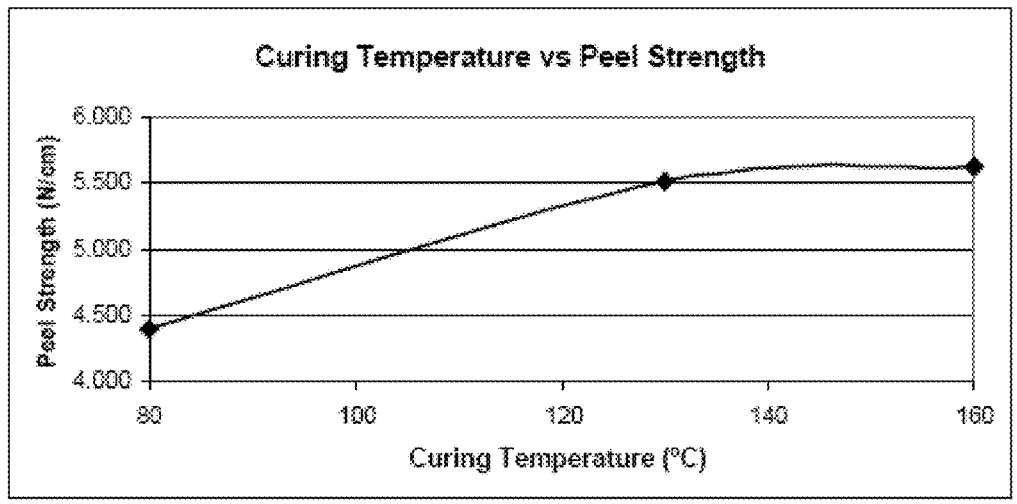

FIG. 6B shows the influence of the elevated temperature (named curing temperature in FIG. 6B) of a dielectric substrate treated with silica particles on the adhesion strength of a copper layer. The silica particles were applied to the dielectric substrate as described in Example 6. The adhesion strength of a copper layer to a dielectric substrate increases with the curing temperature. A maximum adhesion strength of about 5.5 N/cm is achieved at 130° C. curing temperature.

Heating the plastic objects or the substrates according to method step ia., is performed for a time period ranging from 1 to 60 minutes, preferred from 1 to 30 minutes, more preferred from 7 to 20 minutes, most preferred from 5 to 15 minutes.

Method step ia. is performed in order to attach the functional chemical groups present on the surface of the nanometer-sized particles to the surface of the plastic objects or the substrates.

In a preferred embodiment of the present invention a further method step may be performed:
ib. rinsing the plastic objects or the substrates.

Rinsing the plastic objects or the substrates according to method step ib. may be performed in order to remove the non-reacted nanometer-sized particles from the surface of the plastic objects or the substrates.

Rinsing the plastic objects or the substrates may be performed between method step i. and method step ia. or rinsing may be performed as a post-treatment after method step ia.

Method step ib. is performed in an acid solution, an alkaline solution or deionized water. The acid may be any inorganic or organic acid. The chemical base may be any inorganic or organic base. The concentration of the acid or chemical base in the acid solution or alkaline solution, respectively, is set in order not to dissolve the nanometer-sized particles, but keep the particles solvolytically stable and keep a stable suspension or colloid of the nanometer-sized particles. Rinsing the plastic objects or the substrates may be performed for 1 to 10 minutes at a temperature ranging from 25 to 45° C.

Usually, the above-mentioned method steps A), B) and C) do not necessarily have to be performed immediately one after the other. Typically, further method steps such as rinsing steps and optionally further treatment steps are carried out between these method steps. The plastic object or the substrate is treated and/or rinsed off in at least one further method step between method steps B) and C). The indicated sequence of the method steps A), B) and C) must be observed, however.

In one embodiment of the invention a plastic to be metallized is an acrylonitrile-butadiene-styrol copolymer (ABS copolymer) or a polyamide or a mixture of an ABS copolymer and at least one other polymer which is different to the ABS copolymer. Most preferred, the at least one other polymer is polycarbonate (PC). It is preferred, for example, to use ABS/PC blends as the plastic material to be metallized.

In one embodiment of the invention the substrate is a non-conductive or semiconducting substrate and the step
ii. metal plate the substrate applying a wet-chemical plating method; comprises:
  iia. contacting the substrate with a noble metal colloid or a noble metal ion containing solution;
  iib. contacting the substrate with an electroless metal plating solution; and
  iic. contacting the substrate with an electrolytic metal plating solution.

In one embodiment of the invention at least one of the following additional method steps are performed in the overall process step ii.:
  ii1. Dipping the objects or the substrates in a pre-dipping solution;
  iia1. Rinsing the objects or the substrates in a rinsing solution;
  iia2. Treating the objects or the substrates in an accelerating solution or in a reducing agent solution;
  iib1. Rinsing the objects or the substrates in a rinsing solution; and
  iic1. Rinsing the objects or the substrates in a rinsing solution.

In this preferred embodiment these further method steps are carried out when the objects or the substrates are to be metallised using an electroless metallisation method which means that a first metal layer is applied on the objects or the substrates using an electroless method.

The accelerating solution preferably serves to remove components of the colloid solution according to method step iia., for example a protective colloid. If the colloid of the colloid solution according to method step iia. is a palladium/tin colloid, a solution of an acid is preferably used as an accelerating solution, for example sulfuric acid, hydrochloric acid, citric acid or also tetrafluoroboric acid, in order to remove the protective colloid (tin compounds).

The reducing agent solution is used if a solution of a noble metal ion is used in method step iia., for example a hydrochloric acid solution of palladium chloride or an acid solution of a silver salt. The reducing agent solution in this case is also a hydrochloric acid solution and, for example, contains tin(II) chloride, or it contains another reducing agent such as $NaH_2PO_2$ or a borane or boron hydride, such as an alkali or earth alkali borane or dimethylaminoborane.

On the other hand, a method is preferred in which the objects or the substrates are not metallised electrolessly but are to be directly metallised using an electrolytic metallisation process (without electroless metallisation).

In this embodiment of the invention the substrate is a non-conductive or semiconducting substrate and the step
ii. metal plate the substrate applying a wet-chemical plating method; comprises:
  iid. contacting the substrate with a noble metal colloid;
  iie. contacting the substrate with a conversion solution so that a sufficiently electrically conductive layer is formed on the surface of the substrate for direct electrolytic metallisation; and
  iif. contacting the substrate with an electrolytic metal plating solution.

The method steps iid., iie. and iif. are performed in the sequence given, but not necessarily immediately one after the other. For example, a plurality of rinsing steps can be performed after said method steps. In this embodiment the method steps iid. and iie. act as an activation step.

The conversion solution preferably serves to create a sufficiently electrically conductive layer on the surface of the objects or the substrates in order to subsequently allow direct electrolytic metallisation, without preceding electroless metallisation. If the colloid of the colloid solution according to method step iid. is a palladium/tin colloid then an alkaline solution containing copper ions complexed with a complexing agent is preferably used as a conversion solution. For example the conversion solution can contain an organic complexing agent such as tartaric acid or ethylenediaminetetraacetic acid and/or one of its salts, such as a copper salt, such as copper sulfate:

The conversion solution can comprise:
(i) a Cu(II), Ag, Au or Ni soluble metal salt or mixtures thereof,
(ii) 0.05 to 5 mol/l of a group IA metal hydroxide and
(iii) a complexing agent for an ion of the metal of said metal salt The treatment liquids described below are preferably aqueous.

In one embodiment of the invention the etching solution is a chromic acid/sulfuric acid solution or permanganate solution.

After etching it is preferable to carry out a reduction treatment in a reducing agent solution, preferably after one, preferably after a plurality of rinsing steps, for example three, during which the chromium(VI) ions remaining on the surface of the object or the substrates are reduced to chromium(III) ions. It is preferable to use an aqueous solution of sodium sulfite to do this or a hydroxylammonium salt, for example the chloride or the sulfate. This solution is also used at a temperature above room temperature, for example at 30-60° C., particularly preferred at 40-50° C. The treatment time is preferably 0.5-5 min, particularly preferred 1-3 min and most preferred 1.5-2.5 min.

An alternative to etching in the chromic acid/sulfuric acid can also be etching in a sodium or potassium permanganate solution. This solution can be acid or alkaline. To be acidic, it can particularly contain sulfuric acid, and to be alkaline, it can particularly contain sodium hydroxide. Potassium permanganate can be present in a concentration of up to about 70 g/l and sodium permanganate in a concentration of up to about 250 g/l. The lower concentration limit of each of these salts is typically 30 g/l. If the solution is alkaline, it contains 20-80 g/l for example, but preferably 30-60 g/l NaOH. In this case it can also contain a fluorosurfactant to improve wetting of the surfaces of the objects or the substrates. Further, as in the case of chromic acid/sulfuric acid, it can contain palladium ions, for example in the form of a palladium salt, in particular palladium chloride, in a concentration, for example, of 5-100 mg/l, particularly preferred 7-50 mg/l and most preferred 10-30 mg/l, based on $Pd^{2+}$. The permanganate solution is preferably used at a temperature above room temperature, for example at 60-95° C., particularly preferred 80-90° C. The treatment time is preferably 5-30 min, particularly preferred 10-20 min.

After treatment with the permanganate solution the objects or the substrates are subjected to reduction treatment in a reducing agent solution, after rinsing off the excess permanganate solution, in one or a plurality of, preferably three, rinsing steps, in order to reduce the permanganate still adhering on the surfaces of the objects or the substrates to manganese(II) ions. Preferably, in this case an acid solution of hydroxylammonium sulfate or chloride is used or an acid solution of hydrogen peroxide.

Further etching methods are etching by inorganic acids or etching by alkaline solution. Sulfuric acid is suited as an inorganic acid for etching. Sulfuric acid is used in a concentration range of 5-18 M, preferred between 7-11 M.

Alkali metal hydroxides and earth alkali metal hydroxides are suitable alkaline compounds for etching by alkaline solution. Examples for alkali metal hydroxides are potassium hydroxide (KOH), sodium hydroxide (NaOH) or lithium hydroxide (LiOH). Examples for earth alkali metal hydroxides are calcium hydroxide (Ca(OH)2) or barium hydroxide (Ba(OH)2). The above mentioned metal hydroxides are used in a concentration range of 200-450 g/l, preferred 300-400 g/l.

Etching with sulfuric acid or with the above mentioned metal hydroxides is performed at a temperature between 30-90° C., preferred between 60-80° C. Duration of etching with sulphuric acid or with the above mentioned metal hydroxides ranges from 5-60 minutes, preferred from 10-20 minutes.

An etching is not required in order for the nanometer-sized particles of the present invention to impart improved adhesion strength to metal layers deposited on substrates. The sole application of the nanometer-sized particles (without an etching step) contributes the major portion to improvement of the adhesion strength. Nevertheless, the etching has also a minor enhancing influence on the adhesion strength. The combination of etching the substrate prior to applying an adhesion promoter of the present invention significantly enhances the adhesion strength of the deposited metal layer to the substrate surface. This is demonstrated by Example 17.

In a preferred embodiment of the invention the solution of the colloid of the noble metal of Group VIIIB or IB of the Periodic Table of the Elements used in the activation step is an activator solution containing a palladium/tin colloid. This colloid solution preferably contains palladium chloride, tin (II) chloride and hydrochloric acid or sulfuric acid. The concentration of the palladium chloride is preferably 5-100 mg/l, particularly preferred 20-50 mg/l and most preferred 30-45 mg/l, based on $Pd^{2+}$. The concentration of the tin(II) chloride is preferably 0.5-10 g/l, particularly preferred 1-5 g/l and most preferred 2-4 g/l, based on $Sn^{2+}$. The concentration of the hydrochloric acid is preferably 100-300 ml/l (37% by weight of HCl). Furthermore, a palladium/tin colloid solution also preferably contains tin(IV) ions which are generated through oxidation of the tin(II) ions. The temperature of the colloid solution is preferably 20-50° C. and particularly preferred 30-40° C. The treatment time is preferably 0.5-10 min, particularly preferred 2-5 min and most preferred 3.5-4.5 min.

As an alternative the colloid solution can also contain another metal of Group VIIIB or IB of the Periodic Table of the Elements, for example platinum, iridium, rhodium, gold or silver or a mixture of these metals. It is basically possible for the colloid not to be stabilised with tin ions as a protective colloid but rather another protective colloid being used instead, for example an organic protective colloid like polyvinyl alcohol.

If a solution of a noble metal ion is used instead of a colloid solution in the activation step, preferably a solution is used which contains an acid, in particular hydrochloric acid, and a noble metal salt. The noble metal salt can, for example, be a palladium salt, preferably palladium chloride, palladium sulfate or palladium acetate, or a silver salt, for example silver acetate. As an alternative a noble metal complex can also be used, for example a palladium complex salt such as a salt of a palladium-aminopyridine complex.

The noble metal compound is present, for example, in a concentration of 40 mg/l to 80 mg/l, based on the noble metal, for example based on $Pd^{2+}$. The solution of the noble metal compound can be used at 25° C. or at a temperature from 25° C. to 70° C.

Before bringing the objects or the substrates in contact with the colloid solution, the objects or the substrates are preferably first brought into contact with a pre-dipping solution which has the same composition as the colloid solution but without the metal of the colloid and its protective colloid, which means that this solution, in the case of a palladium/tin colloid solution, just contains hydrochloric acid if the colloid solution also contains hydrochloric acid. The objects or the substrates are brought directly into contact with the colloid solution after treatment in the pre-dipping solution, without rinsing off the objects or the substrates.

After treating the objects or the substrates with the colloid solution these are typically rinsed and then brought into contact with the accelerating solution in order to remove the protective colloid from the surface of the objects or the substrates.

If the objects or the substrates are treated with a solution of a noble metal ion instead of a colloid solution they will be subjected to a reduction treatment after first being rinsed. The reducing agent solution used for these cases contains hydrochloric acid and tin(II) chloride if the solution of the noble metal compound is a hydrochloric acid solution of palladium chloride. It is, however, preferable to use an aqueous solution of $NaH_2PO_2$.

The functionalized nanometer-sized particles attached to the substrate surface, in addition, increase the adsorption of activator to the substrate surface. This is shown in Example 16. The higher adsorption of activator to the substrate surface is of advantage for metallizing of the substrates. It facilitates the electroless deposition and in particular the direct metallization. The direct metallization generally requires a higher amount of activator adsorbed to the surface to be metallized. In addition, the concentration of activator (metal colloid or metal salt) can be reduced. In spite of the low concentration of activator its adsorption to the substrate surface is still high enough in order to enable metallizing by electroless deposition as well as by direct metallization.

For electroless metallisation, the objects or the substrates can first be rinsed after the acceleration or treatment with reducing agent solution and then electrolessly plated with nickel, for example. A conventional nickel bath will serve to do this which, for example, contains a number of substances including nickel sulfate, a hypophosphite, for example sodium hypophosphite, as a reducing agent, and organic complexing agents and pH adjusting agents (for example a buffer).

As an alternative, an electroless copper bath can be used which typically contains a copper salt, for example copper sulfate or copper hypophosphite, and also a reducing agent such as formaldehyde or a hypophosphite salt, for example an alkali or ammonium salt, or hypophosphorous acid, and also one or more complexing agents such as tartaric acid, as well as a pH adjusting agent such as sodium hydroxide.

Any metal depositing baths can be used for the subsequent electrolytic metallisation, for example for depositing nickel, copper, silver, gold, tin, zinc, iron, lead or their alloys. This type of depositing bath is well known to the person skilled in the art. A Watts nickel bath is normally used as a bright nickel bath which contains nickel sulfate, nickel chloride and boric acid as well as saccharine as an additive. As a bright copper bath a composition is used which, for example, contains copper sulfate, sulfuric acid, sodium chloride as well as organic sulfur compounds, in which the sulfur is present in a low oxidation stage, for example as an organic sulfide or disulfide, as additives.

If a direct electroplating process is used, that is, a first metal layer is not deposited electrolessly but rather after treatment of the objects or the substrates with the conversion solution and deposited electrolytically after the optional subsequent rinsing treatment, then an electrolytic metallisation bath is used, for example a nickel strike bath, which is preferably composed on the basis of a Watts nickel bath. These types of baths for example contain nickel sulfate, nickel chloride and boric acid and saccharine as an additive.

The thickness of metal layers deposited on substrates by the methods according to the invention ranges from 100 nm to 2 μm and preferred from 100 nm to 1 μm for electroless plating methods and ranges from 10 μm to 50 μm and preferred from 20 μm to 40 μm for electrolytic plating methods. Below 0.1 μm thickness the metal layer is not closed, which means the metal layer has pores and/or cracks. From 0.1 μm thickness and above the metal layer is completely closed and dense, which means the metal layer has neither pores nor cracks. No liquid or chemicals are able to penetrate the metal layer and reach the layer of particles. While the functionalized nanometer-sized nanoparticles of the present invention improve the adhesion of the metal layers deposited thereon, the closed and dense metal layers adhered to the nanoparticles and the subjacent substrate encapsulate the nanoparticles and the substrate surface. Thus, after depositing a metal layer of at least 0.1 μm thickness the functionalized nanometer-sized nanoparticles are protected from any compositions, liquids, chemicals coming in contact with the metallized substrate. The functionalized nanometer-sized nanoparticles cannot be damaged, e.g. dissolved, by any compositions, liquids, chemicals coming in contact with the metallized substrate.

Treatment of the objects or the substrates according to the method according to the invention is preferably performed in a conventional dipping process in which the objects or the substrates are dipped subsequently in solutions in containers in which the respective treatment takes place. In this case the objects or the substrates can either be fastened to racks or filled into drums and dipped in the solutions. Fastening to racks is preferred because a more directed transmission of the ultrasound energy to the objects or the substrates is possible via the racks. Alternatively, the objects or the substrates can be treated in so-called conveyorized processing plants in which they lay, for example, on racks and are continuously transported in a horizontal direction through the plant and treated with ultrasound, as required.

In another embodiment of the present invention direct metallization can be obtained by employing a conductive polymer to the surface of a non-conductive substrate as for example described in US 2004/0112755 A1, U.S. Pat. No. 5,447,824, and WO 89/08375 A.

EP 0 457 180 A2 discloses a method for metallizing non-conductive substrates, this method comprising first forming a manganese dioxide layer on the substrate and then treating the surfaces with an acidic solution containing pyrrole and methane sulfonic acid. Instead of pyrrole the solution may also contain thiophene. Due to this treatment an electrically conducting polymer layer is formed. This electrically conducting layer may finally be electrolytically metallized. Alternatively, thiophene and aniline instead of pyrrole can be applied. Such method is suitable to be used as an activation step and subsequently to metallize non conductive substrates according to the present invention.

Preferably, the nanometer-sized particles according to the present invention are applied to the surface after forming a conductive polymer layer on the substrate surface. Alternatively, however, the nanometer-sized particles according to the present invention can be applied to the surface before forming a conductive polymer layer.

In this embodiment of the invention the substrate is a non-conductive or semiconducting substrate and the following further method steps are performed prior to step i.:
ic. bringing the substrate into contact with a water-soluble polymer;
id. treating the substrate with a permanganate solution;
ie. treating the substrate with an acidic aqueous solution or an acidic microemulsion of aqueous base containing at least one thiophene compound and at least one alkane sulfonic acid selected from the group comprising methane sulfonic acid, ethane sulfonic acid and ethane disulfonic acid;
and the step
ii. metal plate the substrate applying a wet-chemical plating method;
comprises:
iig. contacting the substrate with an electrolytic metal plating solution.

The water-soluble polymer used in step ic. preferably is selected from the group consisting of polyvinyl amine, polyethylene imine, polyvinyl imidazole, alkylamine ethylene oxide copolymers, polyethylene glycol, polypropylene glycol, copolymers of ethylene glycol and polypropylene glycol, polyvinyl alcohol, polyacrylates, polyacrylamide, polyvinylpyrrolidone and mixtures thereof. The concentration of the water-soluble polymer ranges from 20 mg/l to 10 g/l.

The solution of a water-soluble polymer may further contain a water-soluble organic solvent selected from the group consisting of ethanol, propanol, ethylene glycol, diethyleneglycol, glycerine, dioxin, butyrolactone, N-methylpyrrolidone, dimethyl formamide, dimethylacetamide, half ethers and half esters of ethylene glycol. The water-soluble organic solvent may be utilized either in pure form or diluted with water. The concentration of the water-soluble organic solvent ranges from 10 ml/l to 200 ml/l. The solution of a water-soluble polymer is held at a temperature in the range of 25° C. to 85° C. and the dielectric substrate is immersed in this solution for 15 s to 15 min during step ic.

Next, the non-conductive substrate is treated with a permanganate solution in step id. The source of permanganate ions can be any water-soluble permanganate compound. Preferably the source of permanganate ions is selected from sodium permanganate and potassium permanganate. The concentration of permanganate ions ranges from 0.1 mol/l to 1.5 mol/l. The permanganate solution can be either acidic or alkaline. Preferably, the permanganate solution has a pH value in the range of 2.5 to 7. By means of step id. a layer of $MnO_2$ is formed on the side walls of a blind micro via (BMV).

The substrate is then contacted in step ie. with a solution comprising preferably a thiophene compound and an alkane sulfonic acid.

The thiophene compound is preferably selected from 3-heterosubstituted thiophenes and 3,4-heterosubstituted thiophenes. Most preferably, the thiophene compound is selected from the group consisting of 3,4-ethylene dioxythiophene, 3-methoxy thiophene, 3-methyl-4-methoxy thiophene and derivatives thereof. The concentration of the thiophene compound ranges from 0.001 mol/l to 1 mol/l, more preferably from 0.005 mol/l to 0.05 mol/l.

The alkane sulfonic acid is selected from the group comprising methane sulfonic acid, ethane sulfonic acid, methane disulfonic acid, ethane disulfonic acid and mixtures thereof. The concentration of the alkane sulfonic acid is set by adjusting the desired pH value of the solution utilized in step ie. Preferably the pH value of said solution is set in the range of 0 to 3, more preferably in the range of 1.5 to 2.1.

In another embodiment of the invention the substrate is a non-conductive or semiconducting substrate and the following further method step is performed prior to step i.:

if. treating the substrate with a solution comprising at least one organosilane compound.

The additional treatment of the substrate with a solution comprising at least one organosilane compound further improves the adhesion strength of a deposited metal layer to the substrate surface.

Examples of suited classes of organosilane compounds are vinylsilanes, aminoalkylsilanes, ureidoalkylsilane esters, epoxyalkylsilanes and methacryloalkylsilane esters, in which the reactive organic functions are, respectively, vinyl, amino, ureido, epoxy and methacryloxy. Examples of the vinyl-silanes are vinyltrichlorosilane, vinyltriethoxysilane, vinyltrimethoxysilane, vinyl-tris-(beta(2)-methoxyethoxy) silane and vinyltriacetoxysilane. As examples of the amino-alkylsilanes are gamma(3)-aminopropyltriethoxysilane, gamma-aminopropyltri-methoxysilane, N-beta-(Aminoethyl)-gamma-aminopropyltrimethoxysilane, and N'-(beta-aminoethyl)-N-(beta-aminoethyl)-gamma-amino-propyltrimethoxy-silane. A suitable ureidoalkylsilane ester is gammaureidoalkyl-triethoxysilane, while suitable expoxyalkylsilanes are beta-(3,4-epoxycyclo-hexyl)-ethyltrimethoxysilane and gammaglycidoxypropyltrimethoxysilane. Useful methacryloxysilane esters are gamma-methacryloxypropyltrimethoxy silane and gamma-methacryloxypropyl-tris-(beta-methoxyethoxy) silane.

Treating the substrate with a solution comprising at least one organosilane compound is performed for a period of time of between 10 s and 10 minutes at a temperature of between 15 and 50° C.

The organosilane compound is applied as a solution of an organic solvent. Suitable organic solvents comprise alcohols, ethers, amines, and acetates. Examples are ethanol, 2-propanol, tetrahydrofuran, ethylene glycol, diethyleneglycol, glycerine, dioxin, butyrolactone, N-methylpyrrolidone (NMP), dimethyl formamide, dimethylacetamide, ethanolamine, propylene glycol methyl ether acetate (PMA), half ethers and half esters of ethylene glycols.

The concentration of the organosilane can vary over a wide range depending on the application and the specific organosilane compound. Suitable concentrations generally vary between as low as 0.01 wt. % to 30 wt. %, preferably between 0.1 wt. % to 10 wt.

Treating the substrates with a solution containing organosilanes according to method step if. is performed by dipping or immersing the substrates into said solution; or by spraying the solution to the substrates. Treating the substrate with a solution containing organosilanes according to method step if. is performed at least once. Alternatively said treating can be performed several times, preferably between 2 to 10 times, most preferred treating is once to twice.

Treating the substrate with a solution containing organosilanes according to method step if. is performed for a time period ranging from 10 seconds to 20 minutes.

Treating the substrate with a solution containing organosilane according to method step if. is performed at a temperature ranging from 15 to 50° C., preferred from 20 to 35° C.

The embodiment may comprise a further method step performed prior to step if. which includes one or more of the already described pre-treatment steps of etching and/or cleaning the substrate.

If the substrate is a semiconducting substrate a pre-treatment with an alcohol and/or and inorganic acid is suitable. A suited alcohol is methanol, ethanol, propanol, isopropanol or butanol. A suited inorganic acid is sulphuric acid.

A pre-treatment of the substrate surface with a silane prior to applying the functionalized nanoparticles of the present invention further significantly improves the adhesion strength of a subsequently deposited metal layer. This is shown in Example 15.

In another embodiment of the invention the following further method step is performed after step i. and prior to step ii.:

ig. further chemically modifying said nanometer-sized particles within said layer of nanometer-sized particles on the substrate surface.

The functionalities of particles which are already attached to the substrate surface are further modified by reactions known in the field of organic synthetic chemistry in order to create desired organic functional groups. Reaction with one or more than one modifying agent may be carried out simultaneously or subsequently.

A variety of modifying agents may be chemically bonded to the nanometer-sized particle surfaces already attached to the substrate surface. Possible synthetic routes include the following ones:

Nanometer-sized particles having functional chemical groups such as SH, NH or OH may easily be surface modified with modifying agents bearing, for instance, a functional group selected from ester-, epoxy-, carboxy-, carbonyl-, acrylic-, methacrylic-, alkylhalogenide-, alkylsulfate-, anhydride-, terminal double bond-, nitrile- and unsaturated carbonyl-groups. The chemistry of these modifying agents and the organic syntheses (like nucleophilic substitutions, nucleophilic additions, Michael additions, ring-opening reactions, radical addition, etc.) is well known or can easily be adapted to the present solid phase organic chemistry.

Nanometer-sized particles having functional chemical groups on their surfaces such as ester-, epoxy-, carboxy-, carbonyl, acrylic-, methacrylic-, alkylhalogenide-, acid halide, anhydride-, terminal double bond-, nitrile-, azide- and for instance alpha,beta-unsaturated carbonyl-groups may easily be further reacted with a modifying agent bearing a group like —SH, —RNH or —NH$_2$, with the chemical reactions mentioned above.

Preferred modifying agents are selected from glutaric anhydride, maleic anhydride and succinic anhydride.

The reactions can be carried out without using a solvent, e.g. with one of the reaction components which is liquid acting as solvent. It is also possible to carry out the reactions in an organic solvent. Examples of suitable solvents are aliphatic or aromatic hydrocarbons such as alkanes and alkane mixtures, cyclohexane, benzene, toluene or xylene, alcohols like methanol or ethanol, ethers like diethylether, dibutylether, dioxane, tetrahydrofuran (THF).

The reactions are conveniently carried out at temperatures adapted to the starting materials and solvents used. The temperatures and other reaction conditions required for the corresponding reactions are generally known and are familiar to the skilled person. The reaction products can be separated and purified by rinsing the further modified nanometer-sized particle surfaces attached to the substrate surface with deionized water, aqueous solutions or organic solvents.

When plating a metal to a substrate according to above described processes, a pre-treatment step can be performed prior to step i. The pre-treatment steps of the present invention comprise for example cleaning and/or etching of the substrate. All the pre-treatment steps described herein are so called wet chemical pre-treatment steps. Wet chemical pre-treatment steps are steps of treating the substrate with aqueous solutions of chemical compounds or with solutions of chemical compounds in organic solvents.

The methods of the present invention for plating a metal onto a substrate are also suitable for electrical conductive substrates, and electrical semi-conductive substrates.

The electrical conductive substrates to be metallized can be selected from the group comprised of metallic substrates, conductive metal oxides and conductive polymer substrates.

The metallic substrates to be metallized can be selected from the group comprised of copper, zinc, silver, gold, platinum, iron, iridium, tin, aluminum and nickel.

The conductive polymer substrates to be metallized can be selected from the group comprised of polyacetylene (PA), polyparaphenylene (PPP), polyparaphenylene vinylene (PPV), polythiophene (PT), polypyrrole (PPy), polyethylene dioxythiophene (PEDOT); poly(2,5-dialkoxy)-paraphenylene vinylene, e.g. MEH-PPV; poly(3-alkyl)-thiophene (P3AT), wherein alkyl may be methyl or butyl; polyfluorene (PFO), polyaniline (PANI), poly[2,6-(4,4-bis-(2-ethylhexyl)-4H-cyclopenta[2,1-b;3,4-b']-dithiophene)-alt-4,7-(2,1,3-benzothiadiazole)] (PCPDTBT), poly[(4,4'-bis(2-ethylhexyl)dithieno[3,2-b;2',3'-d]silole)-2,6-diyl-alt-(2,1,3-benzothiadiazole)-4,7-diyl] (PSBTBT), poly(9,9-dioctylfluorene-co-bithiophene) (F8T2), poly(2,5-bis(3-alkylthiophen-2-yl)thieno[3,2-b]thiophene) (PBTTT), poly[N-9'-heptadecanyl-2,7-carbazole-alt-5,5-(4',7'-di-2-thienyl-2',1',3'-benzothiadiazole)] (PCDTBT), and poly(5,7-bis(4-decanyl-2-thienyl)-thieno(3,4-b)diathiazole-thiophene-2,5) (PDDTT).

The conductive metal oxides to be metallized can be selected from indium tin oxide (ITO) and aluminium doped zinc oxide (AZO).

The electrical semi-conductive substrates to be metallized can be selected from the group comprised of silicon, germanium, gallium, arsenide and silicon carbide.

The present invention also relates to substrates having a layer of nanometer-sized particles as described above and a metal layer on the substrate surface.

The present invention further relates to substrates obtainable by the methods as described above.

EXAMPLES

The present invention is further illustrated by the following non-limiting examples.

Example 1

Silica nanoparticle colloids were prepared according the Stöber process as described in *Journal of Colloid and Interface Science* 26, 62-69 (1968) by using TEOS (Tetraethylorthosilicate) as the precursor reacted in an ethanol and water mixture. $NH_4OH$ (25%) solution was used as the catalyst to accelerate the hydrolysis and condensation reaction. 44 ml/l of TEOS was added to a solution of 2 ml/l $H_2O$, 10 ml/l $NH_4OH$ and 944 ml/l Ethanol. The solution was stirred for 15 hours at room temperature to obtain highly dispersed colloidal silica particles. The silica particles were washed with ethanol. Afterwards the silica particles were stored in ethanol or in a dried condition or they were used immediately for functionalization. Higher volumes of ammonium hydroxide solution were used to obtain silica colloids with bigger particle size.

Example 2

The surface of the nanometer-sized silica colloids prepared in Example 1 was next functionalized with an alkyl amino group. In order to perform this functionalization 2 ml of 3-aminopropyl triethoxysilane (APTS) was added to 50 ml of prepared colloidal silica solution (2 g of silica particles in 50 ml ethanol). Before adding the amino silane, 57.2 ml/l of acetic acid was added into colloidal silica solution to maintain pH in a range from 3 to 6. The intermediate hydrolysis product of APTS, the corresponding silanol, has a higher stability in that pH range. This reaction mixture was stirred for 2 hours to obtain good mixing between the silica nanoparticles and APTS. Then the reaction mixture was refluxed for 3 hours at 80° C. Refluxing the reaction mixture is needed in order to initiate the condensation between the silanol groups of the APTS hydrolysis product and the surface hydroxyl groups of the silica particles. Afterwards the functionalized silica particles were washed and stored in ethanol.

Example 3

The size distribution of the functionalized silica particles synthesized in Example 2 was determined by DLS.

Samples of the silica particles were prepared by further diluting the ethanol solution containing about 1 wt. % of functionalized silica nanoparticles with absolute ethanol (99 vol. %) to give a concentration that yielded a good signal intensity. Usually the end concentration was in the range 0.1 mg/l to 1 g/l nanoparticles. The prepared samples were filled into a measurement cuvette through a Sartorius cellulose acetate filter (pore size: 5 μm) in order to remove dust and/or artifacts.

The following data of ethanol was used in order to calculate the size distribution of the functionalized silica particles:

Refractive index of ethanol at 25° C.: 1.36
Viscosity of ethanol at 25° C.: 1.1 cP
Measurement conditions were set as listed in Table 1 below:

TABLE 1

| Conditions for DLS measurements | |
|---|---|
| Measurement Time | 500 accumulation |
| Equilibration Time | 120 s |
| Measurement Temperature | 25° C. |
| Analysis Method | Continuous and Accumulant |
| Repetition Time | 2 times |
| Pinhole | 50 μm |
| Dust Limit | Activated |

DLS measurement was performed on an instrument DelsaNano C from BeckmannCoulter with measurement and instrument parameters set to:
Light detection angle: 165°
Wavelength: 658 nm
Cell Center: z=6.3 mm; x=7.55 mm Reproducibility of measurements was reviewed for samples of silica particles synthesized using 10 ml/l and 20 ml/l ammonium hydroxide solution. The variation in intensity of laser light scattered from the particles were autocorrelated to give the corresponding intensity distribution and the average particle diameter and the polydispersity index were calculated according to ISO 22412:2008. The results are shown in Table 2.

TABLE 2

Average diameter and Polydispersity Index of synthesized and functionalized silica particle samples calculated according to ISO 22412: 2008

| Sample | Synthesis condition of silica particles | Average diameter/ nm | Standard Deviation/ nm | Poly-dispersity Index |
|---|---|---|---|---|
| 1 | 10 ml/l NH$_4$OH | | | |
| Measurement 1 | (25 wt. %) | 19.3 | ±0.25 | 0.273 |
| Measurement 2 | | 19.8 | | 0.209 |
| 2 | 20 ml/l NH$_4$OH | | | |
| Measurement 1 | (25 wt. %) | 62.3 | ±0.15 | 0.170 |
| Measurement 2 | | 62.0 | | 0.173 |

The intensity distributions were converted to number based particle size distributions and the values $d_{10}$, $d_{50}$ and $d_{90}$ were calculated on the basis of the number based distributions. The value $d_{50}$ has been defined above. The value $d_{10}$ means that 10% of the particles have a diameter below the $d_{10}$ value and $d_{90}$ means that 90% of the particles have a diameter below the $d_{90}$ value. The d values resulting for silica particle samples synthesized using different volumes of ammonium hydroxide solution are summarized in Table 3.

Figure 2A:
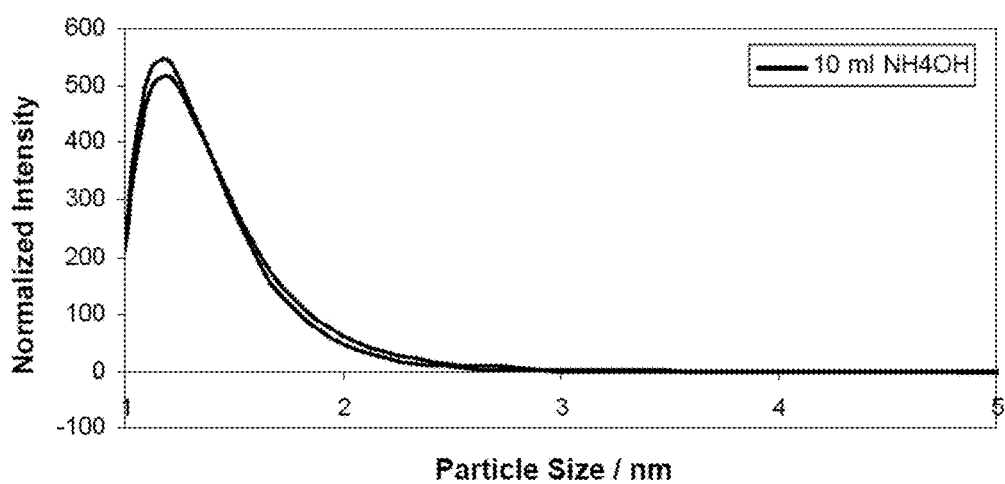
FIG. 2 shows the particle size distribution determined by the Dynamic Light Scattering (DLS) method for synthesized and functionalized nano-sized silica particles.
Figure 2B:
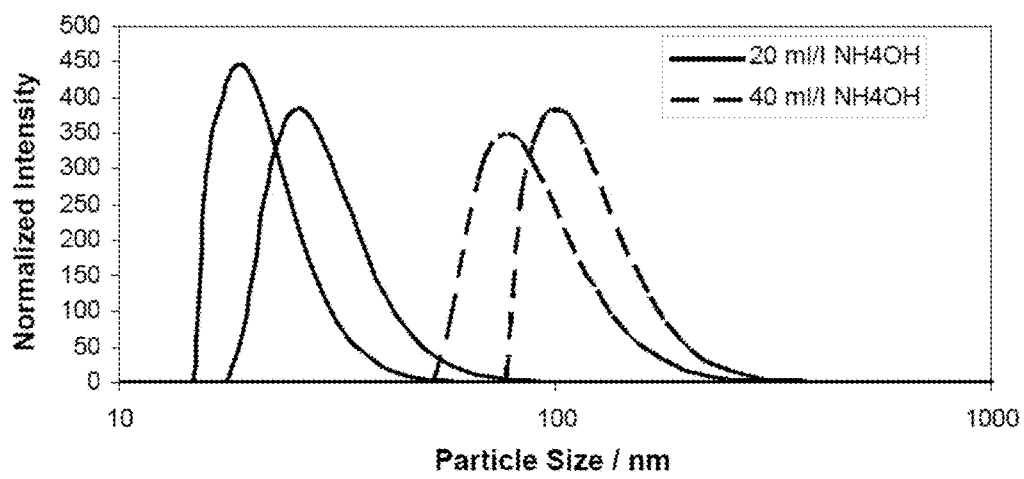

The resulting particle size distributions for different volumes of ammonium hydroxide solution used during synthesis (according to Examples 1 and 2) of the silica particles as determined by DLS are shown in FIG. 2.

TABLE 3

Size distributions of synthesized and functionalized silica particle samples.

| Sample | Synthesis condition of silica particles | Contin/nm | $d_{10}$/nm | $d_{50}$/nm | $d_{90}$/nm |
|---|---|---|---|---|---|
| 1 | 10 ml/l NH$_4$OH (25 wt. %) (FIG. 2A) | 1.3 | 1.1 | 1.2 | 1.6 |
| | | 1.4 | 1.1 | 1.2 | 1.7 |
| 2 | 20 ml/l NH$_4$OH (25 wt. %) (FIG. 2B) | 22 | 16 | 20 | 28 |
| | | 30 | 21 | 27 | 40 |
| 3 | 40 ml/l NH$_4$OH (25 wt. %) (FIG. 2B) | 121 | 83 | 107 | 161 |
| | | 93 | 61 | 82 | 128 |

Example 4

Characterization of the Surface Functionalities of the Silica Particles by FTIR-ATR Spectroscopy The surface functionalities of silica nanoparticles generated in Example 2 were analysed before and after surface functionalization by FTIR-ATR spectroscopy.

The PerkinElmer Spectrum™ 100 FTIR-ATR spectrometer was used to analyse the surface functionalized silica nanoparticles. 100 μl solution containing 40 mg/ml silica particles (sample 2) were applied directly onto the ATR measurement unit (germanium crystal).

The samples of silica particles were analysed within a wavelength number range from 4000 cm$^{-1}$ to 500 cm$^{-1}$ with 4 cm$^{-1}$ resolution for 16 times for a more reliable result. Semi-quantitative analysis was provided by using this instrument.

Figure 3:
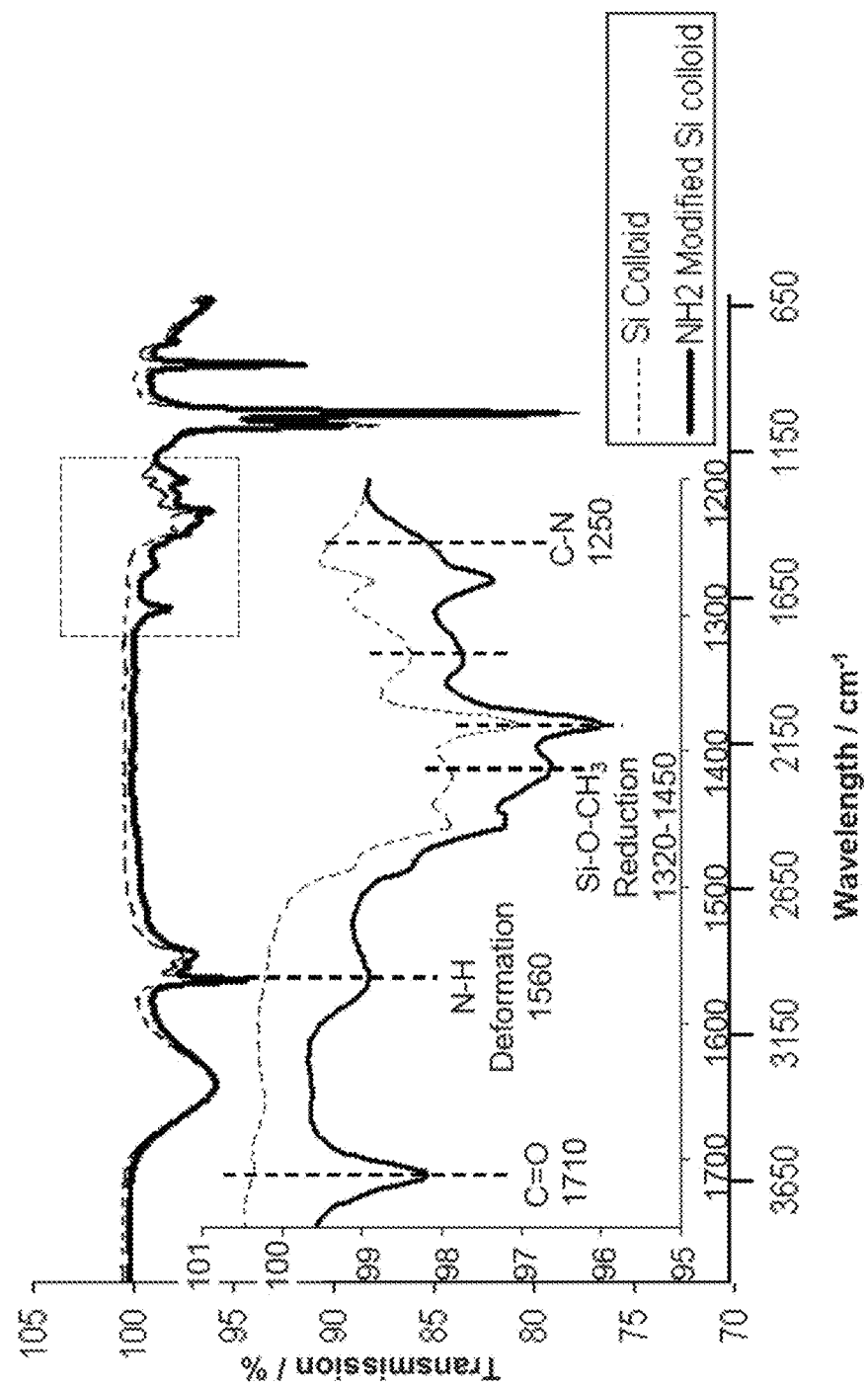
FIG. 3 shows FTIR-ATR spectra of non functionalized silica nanoparticles (Si Colloid) and silica particles functionalized with 3-aminopropyl triethoxysilane (NH2 Modified Si Colloid).

The result is shown in FIG. 3. While the non functionalized silica particles of Example 1 (named Si Colloid in FIG. 3) show no signal at a wavelength number range characteristic for N—H vibrations, the silica particles of Example 2 (named NH2 Modified Si Colloid in FIG. 3) clearly exhibit the deformation vibration of N—H at a wavelength number of 1560 cm$^{-1}$ proving the successful amine functionalization of the silica nanoparticles.

Example 5

Characterization of the Surface Functionalities of the Silica Particles by $^1$H-NMR Spectroscopy In addition, the surface functionalities of silica nanoparticles generated in Example 2 were analysed by $^1$H-NMR spectroscopy before and after surface functionalization.

Samples of non functionalized silica particles of Example 1 (sample 2) and of silica particles functionalized with APTS of Example 2 (sample 2) were prepared.

For preparing the samples at first water was added to silica particles. Afterwards the silica particle suspensions in water were lyophilized and resuspended in CD$_3$OD or a CD$_3$OD/D$_2$O mixture. Non functionalized silica nanoparticles could not be resuspended completely. So filtration was necessary in order to remove insoluble aggregates of particles. Non-functionalized and functionalized silica particles were resuspended in CD$_3$OD or a CD$_3$OD/D$_2$O mixture giving 1 ml each of a suspension containing 40 mg/ml silica particles. These samples were introduced directly to the NMR measurement column at room temperature. $^1$H-NMR spectra were measured on a Bruker NMR spectrometer at 250 MHz at room temperature (23° C.).

Figure 4A:
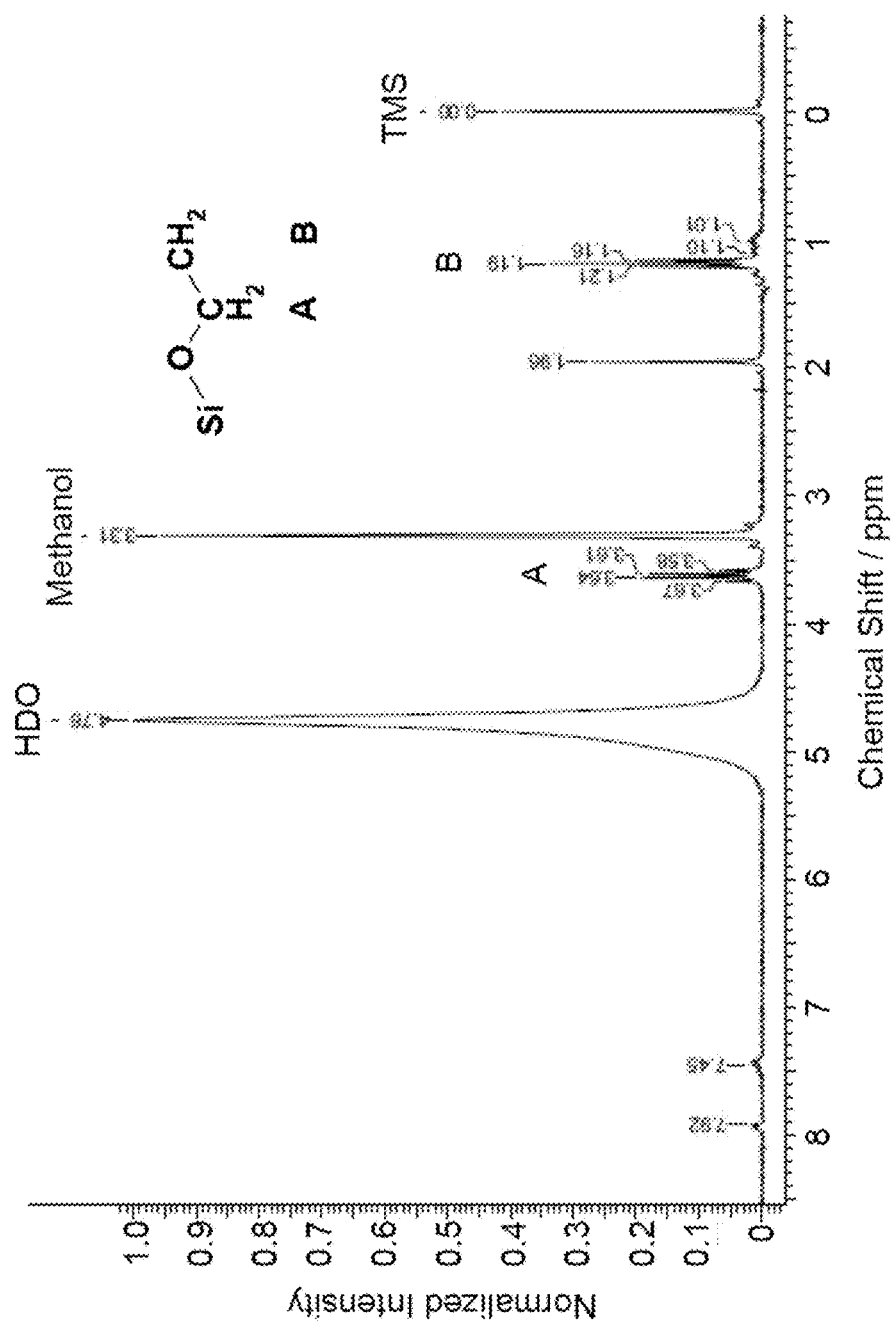
FIG. 4 shows 1H-NMR spectra of non functionalized silica nanoparticles (4A: Blank silica nanoparticles) and silica particles functionalized with 3-aminopropyl triethoxysilane (4B: amine functionalized silica nanoparticles).
Figure 4B:
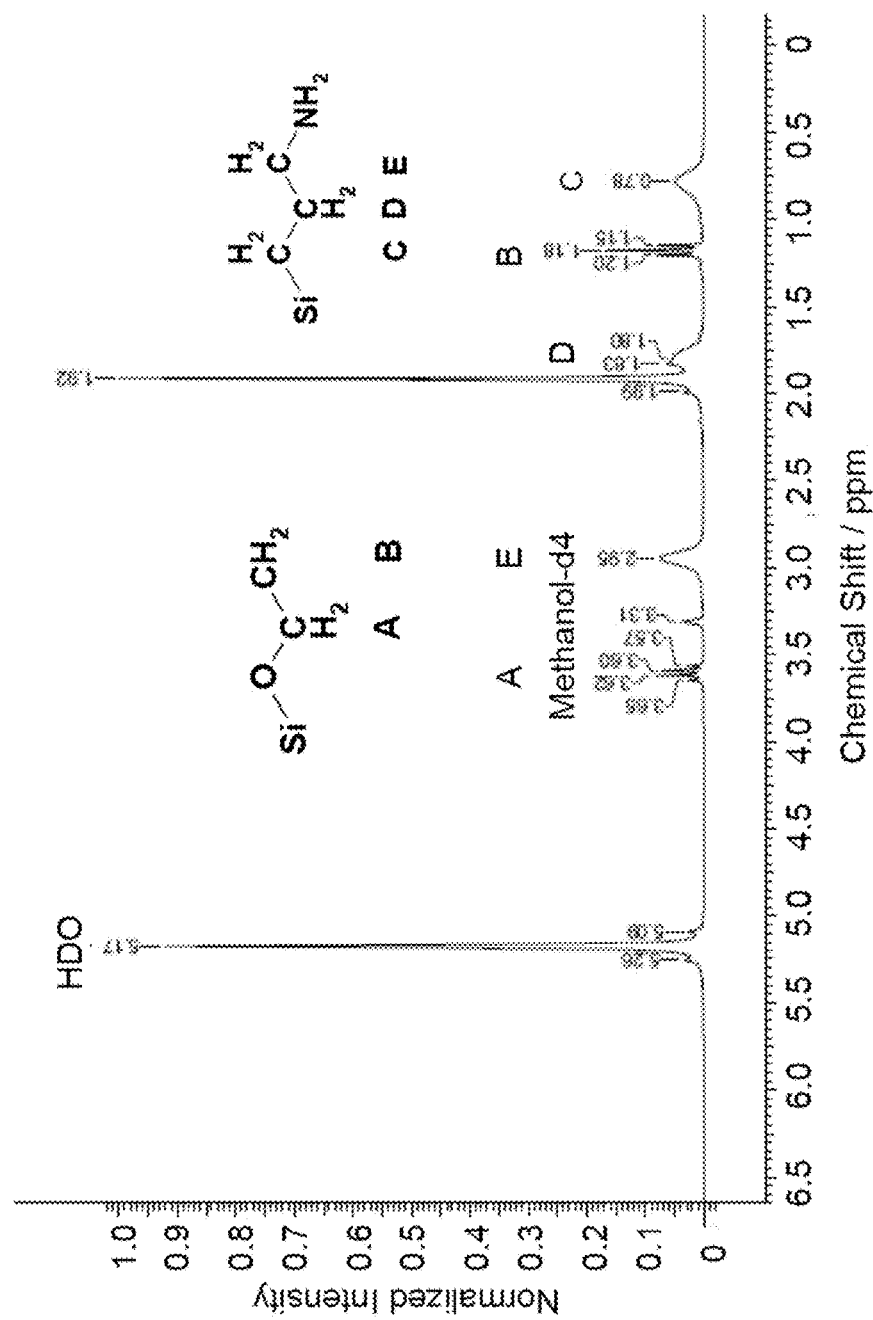

The result of NMR spectroscopy is shown in FIG. 4. FIG. 4A presents the $^1$H-NMR spectrum of non-functionalized silica particles. There are no signals for protons belonging to a propylene group (—CH$_2$—CH$_2$—CH$_2$—). Signals marked with an A (quartet at 3.64 ppm) and B (triplet at 1.19) are caused by ethyl groups originating from TEOS. FIG. 4B shows a spectrum of silica particles functionalized with APTS (3-aminopropyl triethoxysilane). The additional signals with chemical shifts of 0.78 ppm; 1.80 ppm and 2.95 ppm originate from propylene groups. Thus, 3-aminopropyl groups were bound to the surface of the silica particles by reacting the particles with APTS.

Example 6

Functionalized Silica Nanoparticles Applied on a Dielectric Substrate

The dielectric substrate (ABF-GX92, a bisphenol A epichlorhydrin based epoxy resin) with a thickness of 0.6 mm, was cut in the form of coupons with dimensions of 4.7 cm×7.7 cm.

A series I of adhesion promoter solutions was prepared by adding different volumes of amine functionalized silica particle solution of sample 2 (Example 2) to an ethanol solution. The series I of adhesion promoter solutions varied in concentration between 1% and 20% of sample 2 silica particle solution corresponding to 0.5 g/l to 10.0 g/l silica particles (see FIG. 6A and Table 4).

Before applying an adhesion promoter solution, the surfaces of the dielectric substrate coupons were first cleaned by an aqueous alkaline permanganate solution for 30 s and second by an alkaline cleaner (6M KOH in water) for 5 minutes.

A group I of cleaned dielectric substrate coupons were then immersed into series I of adhesion promoter solutions for 5 minutes at 50° C. and afterwards cured in the oven for 10 minutes at 130° C. to attach the amino groups on the surface of the functionalized silica particles to the dielectric substrate surface.

A group II of cleaned dielectric substrate coupons were immersed into the adhesion promoter solution containing 5% of sample 2 silica particle solution (2.5 g/l silica particles) for 5 minutes at 50° C. and afterwards cured in the oven for 10 minutes at varying temperatures between 80-160° C. (see FIG. 6B and Table 5).

Afterwards a post-treatment using alkaline or acid solution was applied to remove the non-reacted adhesion promoter from the surface.

The group I coupons and group II coupons of dielectric substrate treated with functionalized silica particles at different concentrations and curing temperatures were then activated by first predipping in diluted sulphuric acid, activating with ionic palladium and reducing the deposited palladium ions with boron hydride. Subsequently a first copper layer is deposited by an electroless autocatalytic method followed by an annealing step at elevated temperature. Finally the coupons were electrolytically plated with copper in a thickness between 30-40 μm followed by a further annealing step at elevated temperature.

Figure 5:
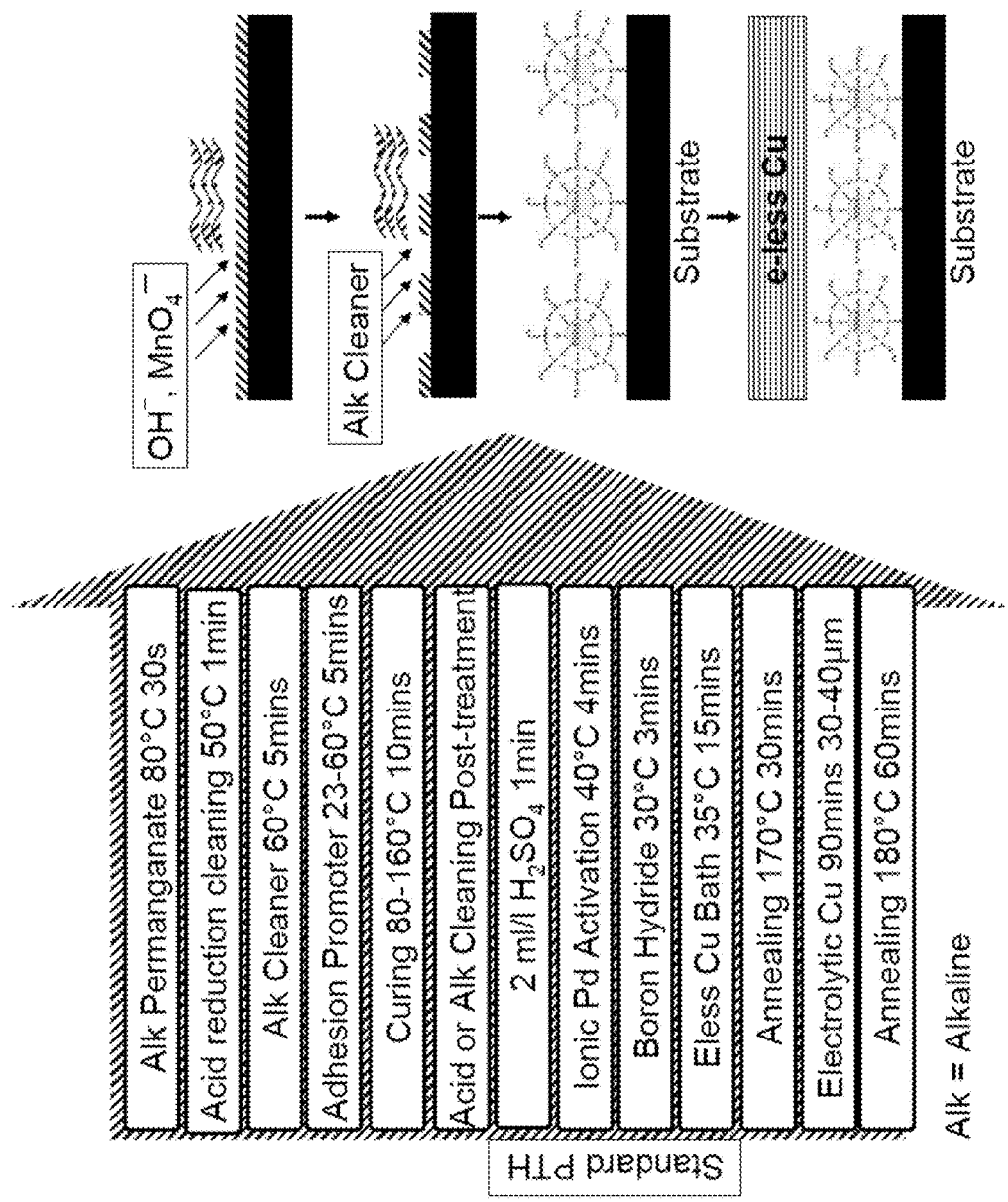
FIG. 5 shows the process sequence for applying functionalized silica nanoparticles as an adhesion promoter for the metallization of a dielectric substrate surface with copper according to the present invention.

The complete process sequence of metalizing a dielectric substrate surface with copper including applying the adhesion promoter according to the present invention is shown in FIG. 5.

Example 7

Analysis of Adhesion Performance of Functionalized Silica Particles

The dielectric substrate coupons which were already plated with copper according to Example 6 were cut into strips of 1 cm width and 7 cm length. Usually one sample coupon gives four measurement stripes on its front and back. A small amount of the copper layer was detached from the substrate by hand and fixed into the peeling machine's moving clam. The moving clam moved slowly upward the measurement stripe with constant peeling speed of 50 mm/min for 20 s. The peeling machine simultaneously measured the force that was needed to peel off the copper layer from the dielectric substrate surface.

FIG. 6 shows the adhesion performance of functionalized silica nanoparticles as adhesion promoter between a copper layer and a dielectric substrate. In FIG. 6A the influence of the concentration of the functionalized silica particles on adhesion strength between the copper layer and the dielectric substrate is presented (group I coupons). In addition, Table 4 shows the resulting adhesion strength (peel strength) for different concentrations of applied functionalized silica particles. If no functionalized silica particles (concentration 0%) are applied to the dielectric substrate, a force of 0.6 N/cm is needed to peel off the copper layer. Thus, only a low adhesion of the copper layer to the substrate is achieved without adhesion promoter. For increasing concentrations of functionalized silica particles applied to the dielectric substrate prior to depositing the copper layer an increasing adhesion is observed between substrate and copper layer.

TABLE 4

Adhesion strength (peel strength) for different concentrations of applied functionalized silica particles.

| Volume of sample 2/% | Concentration of silica particles/g/l | Peel strength/N/cm |
| --- | --- | --- |
| 0 | 0 | 0.6 |
| 1 | 0.5 | 2.9 |
| 5 | 2.5 | 5.5 |
| 10 | 5 | 8.5 |
| 20 | 10 | 9.2 |

FIG. 6B shows the influence of the temperature used for curing after applying functionalized silica particles to the dielectric substrate (group II coupons) prior to depositing the copper layer. Best adhesion of the copper layer to the dielectric substrate is achieved at temperatures of 130° C. and higher. In addition, Table 5 shows the resulting adhesion strength (peel strength) for different curing temperatures.

TABLE 5

Adhesion strength (peel strength) for different curing temperatures.

| Curing Temperature/° C. | Peel strength/N/cm |
| --- | --- |
| 80 | 4.4 |
| 130 | 5.5 |
| 160 | 5.6 |

Example 8

Amine Functionalized Silica Nanoparticles Applied on Silicon Wafers as Substrates Functionalized silica particles of Example 2 (sample 2) were used as adhesion promoter for adhering a cobalt-tungsten-phosphorous (CoWP) alloy layer to the surface of a silicon wafer. Silicon wafer samples with a thickness of 0.6 mm were prepared in the size of 3 cm×2 cm. A first group of these silicon wafer samples were coated with a layer of the adhesion promoter and afterwards the CoWP alloy layer was deposited according to the process sequence presented in table 6. A second group of the silicon wafer samples were coated with the CoWP alloy layer only. The adhesion promoter was not applied to this second group of silicon wafer samples.

Before applying the adhesion promoter, the silicon wafer samples of group 1 were first treated with 6 M KOH at 60° C. for 10 minutes. Afterwards 10% $H_2SO_4$ was used at room temperature for 1 minute in order to remove an access of KOH from the surface. The wafer samples were then dipped into the adhesion promoter solution (50 g/l silica particles) for 5 minutes and removed slowly with a speed of 3 mm/s and rinsed with deionized water to remove residual adhesion promoter. Thereafter a curing step was performed in the oven for 10 minutes at 130° C. to initiate bonding between the silicon wafer and the adhesion promoter. In subsequent process steps the wafer surface was activated with $PdSO_4$, reduced with 50% hypophosphite and a CoWP alloy layer deposited from a bath containing a cobalt salt, a tungsten salt, a phosphorous source, a reducing agent, a complexing agent and a stabilizing agent. Additional rinsing steps and further conditions are listed in the process sequence in Table 6.

The second group of the silicon wafer samples were treated in the same way except that steps 5-7 of the process sequence were omitted.

TABLE 6

Process sequence for coating a silicon wafer with
a layer of the adhesion promoter of the present
invention and depositing a CoWP alloy layer.

| Sequence | Time | Chemistry | Condition | Remark |
|---|---|---|---|---|
| 1 | 10 min | KOH 6M | 60° C. | |
| 2 | 1 min | $H_2O$ Rinse | RT | |
| 3 | 1 min | $H_2SO_4$ 10% | RT | |
| 4 | 1 min | $H_2O$ Rinse | RT | Drying |
| 5 | 5 min | Adhesion Promoter | RT | |
| 6 | 1 min | $H_2O$ Rinse | RT | |
| 7 | 10 min | Curing | 130° C. | |
| 8 | 10 min | $PdSO_4$ 200 ppm | RT | Drying |
| 9 | 1 min | $H_2O$ Rinse | RT | Drying |
| 10 | 3 min | 50% $NaH_2PO_2$ | 60° C. | Drying |
| 11 | 5 min | CoWP alloy | 77° C. | |
| 12 | 1 min | $H_2O$ Rinse | RT | Drying |

Example 9

Analysis of Adhesion Performance of Functionalized Silica Particles

The adhesion performance of amine functionalized silica nanoparticles as adhesion promoter between the CoWP alloy layer and the silicon wafer of Example 8 was tested by the following adhesion test.

The adhesion test was performed using Tesa Tapes having a peel strength amount of 1.1 N/cm and a peel strength amount of 4.5 N/cm. Stripes of the tapes were stuck on samples of CoWP alloy plated silicon wafers with (group 1) and without the adhesion promoter (group 2). Afterwards the tape stripes were peeled off with their inherent peel strength. The results of the adhesion test are presented in Table 7.

TABLE 7

Results of the adhesion test for silicon wafer
substrates treated and untreated with adhesion
promoter prior to depositing a CoWP alloy layer

| | Peel strength of Tape | Result of adhesion test |
|---|---|---|
| With Adhesion Promoter (Group 1) | 1.1 N/cm | Tape test: PASSED |
| | 4.5 N/cm | Tape test: PASSED |
| No Adhesion Promoter (Group 2) | 1.1 N/cm | Tape Test: FAILED |

"Tape test passed" means that by peeling off the tape from the surface of the plated silicon wafer no part of the CoWP alloy layer was removed from the silicon wafer.

"Tape test failed" means that by peeling off the tape from the surface of the plated silicon wafer the CoWP alloy layer was completely removed from the silicon wafer.

For silicon wafers treated with the adhesion promoter even the peeling off of a tape with peel strength of 4.5 N/cm did not remove the CoWP layer from the silicon wafer. Thus, the adhesion strength of the CoWP layer to the silicon wafer surface was well above 4.5 N/cm. For silicon wafers metallized without treatment with the adhesion promoter already peeling off of a tape with peel strength of 1.1 N/cm completely removed the CoWP layer from the silicon wafer. Hence, without applying the adhesion promoter the adhesion strength of the CoWP layer to the silicon wafer surface was even below 1.1 N/cm.

While the silicon wafers treated with adhesion promoter exhibited good adhesion to the CoWP alloy layer, silicon wafer substrates lacking treatment with adhesion promoter presented poor adhesion to the CoWP layer. Example 9 demonstrates that application of silica particles to a silicon wafer significantly improves the adhesion strength of an alloy layer to the silicon surface.

Example 10

According to the Invention

Amine Functionalized Silica Nanoparticles Applied on Different Dielectric Substrates The adhesion strength imparted by amine functionalized silica nanoparticles (sample 2, Example 2) to metal layers on different substrate materials (see table 8) was tested. The substrates were treated as outlined in the following.

Experimental Sequence:
1. $KMnO_4$ pretreatment: 60 g/l; 80° C.; 1 min
2. Reduction solution (Atotech Securiganth P 500 Reduction Solution): 50° C.; 1 min
3. Alkaline Cleaner (Atotech Securiganth 902 Cleaner): 60° C.; 5 min
4. Adhesion Promoter (4 g/l Amino propyl modified silica nanoparticles): 60° C.; 5 min
5. Annealing: 130° C.; 10 min
6. Pd activator pre dip (Atotech Neoganth Pre Dip B): 25° C.; 1 min
7. Pd activator (Atotech Neoganth Activator 834): 40° C.; 4 min
8. Pd reduction solution (Atotech Neoganth WA Reducer): 30° C.; 3 min
9. E-less copper bath (e' less Cu, Atotech Printoganth MV Plus): 35° C.; 5 min; about 300 nm
10. Annealing: 150° C.; 30 min
11. Electrolytic Copper (Atotech Cupracid TLC): 25° C.; 2 A/dm²; 90 min; about 40 μm
12. Annealing: 180° C.; 60 min
13. 90° Adhesion test by a peeling machine as described in Example 7. Substrates were cut into dimensions of 4.4×7.7 cm.
Peeling speed 45 mm/min For samples 11, 12, 15 and 16 step 10 of the substrate treatment was changed to:
10. Annealing: 180° C.; 60 min For samples 13, 14, 17 and 18 steps 6 to 10 of the substrate treatment were changed as follows in order to electrolessly deposit nickel instead of electroless deposition of copper:

Pd activator (Atotech Cerabond M activator): 35° C.; 2 min
Pd reduction solution (Atotech Cerabond M Ni Reducer). 70° C.; 1 min
E-less Nickel bath (Atotech Aurotech CNN Mod): 86° C.; 1 min; about 150 nm
Annealing: 180° C.; 60 min Results:

TABLE 8

Adhesion strength (peel strength) for different non-
conductive substrate materials. ABF-GX92 and T31
are bisphenol A epichlorhydrin based epoxy resins.

| Substrate material | Sample | Adhesion Promoter | Peel Strength (N/cm) |
|---|---|---|---|
| PEEK | 1 | No | 0 (Blisters) |
| | 2 | Yes | 2.2 |
| ABF-GX 92 (Ajinomoto) | 3 | No | 0.6 |
| | 4 | Yes | 8.5 |

TABLE 8-continued

Adhesion strength (peel strength) for different non-
conductive substrate materials. ABF-GX92 and T31
are bisphenol A epichlorhydrin based epoxy resins.

| Substrate material | Sample | Adhesion Promoter | Peel Strength (N/cm) |
|---|---|---|---|
| ABF-GX T31 (Ajinomoto) | 5 | No | 0.5 |
| | 6 | Yes | 9.0 |
| ABF-GZ 45 (Ajinomoto) | 7 | No | 0.5 |
| | 8 | Yes | 8.2 |
| ABF-GY 12 (Ajinomoto) | 9 | No | 0.4 |
| | 10 | Yes | 3.6 |
| Polyimide, Kapton 100 ENF | 11, eless Cu | No | 0 |
| | 12, eless Cu | Yes | 9.1 |
| | 13, eless Ni | No | 0 |
| | 14, eless Ni | Yes | 9.3 |
| Polyimide, Kapton 30 ENF | 15, eless Cu | No | 0 |
| | 16, eless Cu | Yes | 13.4 |
| | 17, eless Ni | No | 0 |
| | 18, eless Ni | Yes | 13.2 |

ABF-GZ45 is epoxy resin and cyanate ester. ABF-GY12 is an epoxy resin with a phenolic ester hardener and a phenol ester hardener. PEEK is Polyether ether ketone.

While the polymer substrates treated with adhesion promoter exhibited excellent adhesion to the copper layer or nickel/copper layers, polymer substrates lacking treatment with adhesion promoter presented poor adhesion to the metal layer. Example 10 demonstrates that application of silica particles of the present invention to polymer substrates significantly improves the adhesion strength of a metal layer to the polymer surface.

Example 11

According to the Invention

Functionalization of Nanometer-Sized Silica Particles with Ureido Groups

The surface of the nanometer-sized silica colloids prepared in Example 1 was functionalized with an ureidopropyl group. 100 ml of the colloidal silica suspension from Example 1 was transferred into a glass reactor. The pH of the silica suspension was decreased to pH 4-5 by adding 1M acetic acid. 3-Ureidopropyltrimethoxysilane (50% in methanol) was slowly added with a constant flow rate of 3 ml/min until the concentration was 0.34 M of the silane in the reaction mixture. The reaction mixture was stirred with 400 rpm and kept at a temperature of 20° C. (room temperature). After 1 h, the temperature was risen slowly with a rate of $\Delta T=5$ K/min from 20° C. to 75° C. and refluxed for 3 hours. The suspension solution of ureidopropyl functionalized silica nanoparticles (also called ureido silica nanoparticles) was collected after cooling down to room temperature.

Characterization of Ureido Silica Nanoparticles by Elemental Analysis:

Elemental Analysis is a method for determining the elements contained in an organic or inorganic compound which is well known to persons skilled in the art. For the ureido silica nanoparticles the following composition of elements was obtained:

Carbon: 22.9% weight Hydrogen: 5.34% weight Nitrogen: 11.11% weight and the remaining 60.65% weight are silicon and oxygen.

Thus, an organic component is attached to the silica nanoparticles with a composition roughly corresponding to an ureidopropyl group.

Characterization of ureido silica nanoparticles by Dynamic light Scattering:

Determination of size of the ureido silica nanoparticles was determined by DLS as described in Example 3. The results are presented in Table 9. The ureido silica nanoparticles have an average diameter of 34.2 nm±0.1 nm.

TABLE 9

Average diameter and Polydispersity Index of synthesized ureido silica nanoparticles.

| Sample | Average diameter/ nm | Standard Deviation/ nm | Polydispersity Index |
|---|---|---|---|
| Measurement 1 | 34.06 | ±0.14 | 0.139 |
| Measurement 2 | 34.26 | | 0.135 |
| Measurement 3 | 34.19 | | 0.135 |

Example 12

According to the Invention

Functionalization of Nanometer-Sized Silica Particles with Allylether Groups and Sodium Carboxylate Groups The surface of the amino functionalized nanometer-sized silica colloids prepared in Example 2 was further functionalized with allylether groups and sodium carboxylate groups. After functionalization the nanometer-sized silica particles have both chemical functional groups simultaneously.

50 g of amino functionalized silica nanoparticle (sample 2 of Example 2) dispersion, 25 wt. % in EtOH, was mixed with 2.45 g (21.52 mmol) allyl-glycidylether and stirred at 50° C. for 18 h. A solution of 4.30 g (43.06 mmol) succinic anhydride in 100 ml acetone was prepared separately and rapidly added to above ethanolic dispersion while mixing constantly. Formation of a sticky white product was observed. The solvent (EtOH/acetone) was decanted and the residue dried in vacuo. A solution of 3.61 g (43.06 mmol) NaHCO$_3$ in 100 ml H$_2$O/isopropanol (80/20) was added and the mixture homogenized. 115 g of a homogeneous dispersion with a solid content of 18% was obtained.

$^1$H-NMR analysis was performed as described in Example 5. It confirmed the functionalizations and showed a ratio of succinate/allylether of 65/35. Dynamic light scattering (DLS) was performed as described in Example 3. The resulting silica nanoparticles functionalized with allylether and carboxylate groups had an average diameter of 41.5 nm±0.2 nm.

Example 13

According to the Invention

Silica Nanoparticles with Different Functionalizations Applied on a Dielectric Substrate The adhesion strength imparted by silica nanoparticles with different functionalizations (see table 10) to copper layers on a dielectric substrate was tested. The dielectric substrate was made of ABF-GX 92 from Ajinomoto. The substrates were treated as outlined in the following.

Experimental Sequence:
1. KMnO4 pretreatment: 60 g/l; 80° C.; 1 min
2. Reduction solution (Atotech Securiganth P 500 Reduction Solution) 50° C.; 1 min 3. Alkaline Cleaner (Atotech Securiganth 902 Cleaner): 60° C.; 5 min
4. Adhesion Promoter (4 g/l modified silica nanoparticles): 60° C.; 5 min
5. Annealing: 130° C.; 10 min
6. Pd activator pre dip (Atotech Neoganth Pre Dip B): 25° C.; 1 min
7. Pd activator (Atotech Neoganth Activator 834): 40° C.; 4 min
8. Pd reduction solution (Atotech Neoganth WA Reducer): 30° C.; 3 min
9. E-less copper bath (Atotech Printoganth MV Plus): 35° C.; 15 min; about 1 µm
10. Annealing: 150° C.; 30 min
11. Electrolytic Copper (Atotech Cupracid TLC): 25° C.; 2 A/dm2; 90 min; about 40 µm
12. Annealing: 180° C.; 60 min
13. 90° Peeling: Adhesion test by a peeling machine as described in Example 7. Peeling speed 45 mm/min Example 13 demonstrates that application of silica particles having different functionalizations to a dielectric substrate significantly improves the adhesion strength of a metal layer to the dielectric substrate. Example 13 further demonstrates that silica particles functionalized with an amino group or an ureido group impart better adhesion strength between metal layers and dielectric substrates than silica particles functionalized with additional allylether groups.

Results:

TABLE 10

Adhesion strength (peel strength) for silica nanoparticles with different functionalizations on a dielectric substrate.

| Sample | Functionalization of nanoparticles | Peel Strength (N/cm) |
| --- | --- | --- |
| 1 | No particles | 0 |
| 2 | Ureido (according to Example 11) | 2.2 |
| 3 | Amino (according to Example 2 (sample 2)) | 9.2 |
| 4 | Allylether and Carboxylate (according to Example 12) | 1.6 |

Example 14

According to the Invention

Silica Nanoparticles with Different Functionalizations Applied on Silicon Wafers as Substrates The adhesion strength imparted by silica nanoparticles with different functionalizations (see table 11) to nickel layers on silicon wafer was tested. The silicon wafer substrates were treated as outlined in the following.

Experimental Sequence:
1. Isopropanol: 25° C.; 30 s
2. Sulfuric acid (5%): 25° C.; 1 min
3. Adhesion Promoter (4 g/l modified silica nanoparticles): 60° C.; 5 min
4. Annealing: 130° C.; 10 min
5. Pd activator (Atotech Cerabond M activator): 35° C.; 3 min
6. Pd reduction solution (Atotech Cerabond M Ni Reducer): 70° C.; 2 min
7. E-less Nickel bath (Atotech Aurotech HP): 75° C.; 2 min; about 100 nm
8. Annealing: 130° C.; 10 min
9. Tape Test: Adhesion test using Tesa Tapes according to Example 9. Tesa Tapes had a peel strength amount of 4.5 N/cm.

Results:

TABLE 11

Adhesion strength (peel strength) for silica nanoparticles with different functionalizations on silicon wafer substrates.

| Sample | Functionalization of nanoparticles | Pass tape test |
| --- | --- | --- |
| 1 | No particles | No |
| 2 | Amino (according to sample 2 of Example 2) | Yes |
| 3 | Ureido (according to Example 11) | Yes |

For silicon wafers treated with adhesion promoters having different functionalizations the peeling off of a tape with peel strength of 4.5 N/cm did not remove the nickel layer from the silicon wafer. Thus, the adhesion strength of the nickel layer to the silicon wafer surface was well above 4.5 N/cm. For silicon wafers metallized without treatment with the adhesion promoter the peeling off of the tape completely removed the nickel layer from the silicon wafer. Hence, without applying an adhesion promoter the adhesion strength of the nickel layer to the silicon wafer surface was below 4.5 N/cm. Example 14 demonstrates that application of silica particles having different functionalizations to a silicon wafer significantly improves the adhesion strength of a metal layer to the silicon surface.

Example 15

According to the Invention

Additional Pre-Treatment of Substrates with Silanes

Prior to applying functionalized silica nanoparticles to a substrate, the substrate surface was additionally treated with a silane. The silane was (3-Glycidoxypropyl)trimethoxysilane. The substrate was a silicon wafer. The ureido silica nanoparticles of Example 11 were used as adhesion promoter. Electrolessly deposited nickel layers had a thickness of 150 nm. The silicon wafer substrates were treated as outlined in Example 14 and the Experimental Sequence contained the following additional step between steps 2 and 3:

Silanization of silicon substrate: 0.1% (3-Glycidoxypropyl)trimethoxysilane; 25° C.; 3 min Instead of measuring the adhesion strength by a tape test as described in Example 14 (step 9), the adhesion strength of the deposited nickel layers was determined by a Centrifugal adhesion test. The centrifugal adhesion test was performed on the Adhesion Analyser LUMIFrac® which is a product of LUM GmbH, Germany. The Adhesion Analyser LUMIFrac is in principle a centrifuge with a special rotor. A sample of a metallized substrate according to the invention is mounted to the rotor and an inspection stamp (metal stamp) is fixed to the metal surface. The centrifuge is programmed to rotate the rotor with increasing speed. This increases the centrifugal force applied to the sample and the metal stamp until the metal stamp is released from the sample thereby pulling off the metal layer from the substrate surface (breaking point). During rotation a measuring electronics enables to detect the time and rotor speed at the breaking point. These data are transmitted to the SEPView® software belonging to the LUMIFrac® analyser. The software automatically calculates the corresponding force of breakage and thus the adhesion strength in N/mm$^2$.

The rotor was set to gain speed corresponding to an increasing Force Rate of 5 N/s. The Peeled Area of the metal layer was 38.5 mm² and the Mass of the metal stamp was 19.18 g. The resulting adhesion strengths (peel strength) for the metallized substrate samples are summarized in table 12.

Example 15 shows that a pre-treatment of the substrate surface with a silane prior to applying the functionalized nanoparticles of the present invention further significantly improves the adhesion strength of a subsequently deposited metal layer.

Results:

TABLE 12

Adhesion strength (peel strength) for a substrate additionally pre-treated with a silane.

| Sample | Silane (%) | Modified nanoparticles | Peel Strength (N/mm²) |
|---|---|---|---|
| 1 | 0 | 0 | 0 (Peel out during plating) |
| 2 | 0.1 | 0 | 0 (Peel out during plating) |
| 3 | 0 | 4 | 1.82 |
| 4 | 0.1 | 4 | 3.53 |

Example 16

According to the Invention

Influence of Silica Nanoparticles with Different Functionalizations on Adsorption of an Activator onto a Substrate Dielectric substrates were treated as described in Example 13 until activation with Palladium was completed (steps 1 to 8). Afterwards palladium was dissolved in aqua regia (aqua regia:deionized water=1:1) for 5 minutes at 25° C. The concentration of palladium was determined in the resulting solution by Inductively Coupled Plasma Optical Emission Spectrometry (ICP-OES). Silica nanoparticles with different functionalizations (see table 13) were used as adhesion promoter. The substrate was a dielectric substrate made of ABF-GX 92 from Ajinomoto and was cut in dimensions of 10×10 cm.

ICP-OES is known to persons skilled in the art. ICP-OES is a method of chemical analysis that uses the intensity of light emitted from an inductively coupled plasma at a particular wavelength to determine the quantity of an element in a sample. The wavelength of the atomic spectral line gives the identity of the element while the intensity of the emitted light is proportional to the number of atoms of the element. The ICP-OES measurements were performed with an atomic emission spectrometer Varian Vista MPX. At first the spectrometer was calibrated with standard solutions containing 0.10 mg/l; 0.25 mg/l; 0.50 mg/l; 2.0 mg/l and 5.0 mg/l palladium in 1% $HNO_3$. Samples were added to 1% $HNO_3$ and analyzed directly.

The spectrometer was set to the following parameters:
Wavelengths for palladium: 340,458 nm and 360,955 nm
Repetition of measurements: 3
Nebulizer gas pressure: 200 kPa
Auxiliary gas flow rate: 1.5 l/min
Plasma gas flow rate: 16.5 l/min
RF-Power: 1250 Watt The measured values were interpreted by the ICP Expert software belonging to the spectrometer and presented directly as concentration values in mg/l. The resulting palladium concentrations were used to calculate the palladium amount per unit area for each sample. The data are summarized in Table 12.

Results

TABLE 13

Amount of palladium adsorbed to substrate surfaces treated with functionalized oxide nanoparticles prior to activation

| Sample | Functionalization of nanoparticles | Pd concentration (mg/m²) |
|---|---|---|
| 1 | No particles | 1 |
| 2 | Amino (according to Example 2 (sample 2)) | 3.25 |
| 3 | Ureido (according to Example 11) | 2.75 |
| 4 | Allylether and Carboxylate (according to Example 12) | 1.75 |

Example 16 shows that application of silica particles having different functionalizations to a non-conductive substrate significantly improves the adsorption of an activator, e.g. palladium, to the surface of the substrate. Example 16 further shows that silica particles functionalized with an amino group or an ureido group impart a better adsorption of an activator than silica particles functionalized with additional allylether groups.

Example 17

According to Invention

Influence of Different Etching or Cleaning Methods on Adhesion Strength

Example 17A

In a first experiment a dielectric substrate was etched, treated with adhesion promoter (amino functionalized silica nanoparticles of sample 2 of Example 2) and metallized as described in Example 13. In a second experiment the etching steps: $KMnO_4$ pre-treatment and Reduction solution (steps 1 and 2), were omitted. The adhesion strength of the deposited copper layer on both sample substrates was determined as described in Example 13. The dielectric substrate was made of ABF-GX 92 from Ajinomoto.

Results:

TABLE 14

Influence of etching step on adhesion strength

| Sample | Etching steps | Peel Strength (N/cm) |
|---|---|---|
| 1 | yes | 9.2 |
| 2 | no | 5.2 |

The combination of etching the substrate prior to applying an adhesion promoter of the present invention significantly enhances the adhesion strength of the deposited metal layer to the substrate surface. Nevertheless, Example 17A clearly shows that the sole application of the adhesion promoter (without an etching step) contributes the major portion to improving the adhesion strength of the deposited metal layer to the substrate surface.

Example 17B

Samples of a dielectric substrate were etched with different etching methods (see below), treated with adhesion promoter (amino functionalized silica nanoparticles of sample 2 of Example 2), metallized and the adhesion strengths of the deposited copper layers were determined as described in Example 13. The dielectric substrate was made of ABF-GX 92 from Ajinomoto. The following etching methods were used:

Permanganate Etching:
1. $KMnO_4$: 60 g/l; 80° C.; 1 min
2. Reduction solution (Atotech Securiganth P 500 Reduction Solution): 50° C.; 1 min NaOH Etching:
400 g/l of NaOH, 80° C.; 15 min Piranha Solution:
98% $H_2SO_4$: 32% $H_2O_2$=5/5; 25° C.; 5 min In contrast to Example 13 the steps 4, 9 and 10 of the experimental sequence were changed to:
4. Adhesion Promoter: 0.8 g/l Amino propyl modified silica nanoparticles, 60° C.; 5 min
9. E-less copper bath (Atotech Printoganth MV Plus): 35° C.; 5 min; about 300 nm
10. Annealing: 180° C.; 60 min.

Results:

TABLE 15

Influence of etching step on adhesion strength

| Sample | Etching method | Adhesion Promoter (g/l) | Peel Strength (N/cm) |
|---|---|---|---|
| 3 | Permanganate | No | 0 |
| 4 | | Yes | 4.2 |
| 5 | NaOH | No | 0 |
| 6 | | Yes | 3.4 |
| 7 | Piranha | No | 0 |
| 8 | | Yes | 3.6 |

Example 17B shows that different etching methods can be combined with application of the adhesion promoter of the present invention in order to achieve an improvement of the adhesion strength of the deposited metal layer to the substrate surface.

Example 18

According to Invention

Surface Structures of Metallized Substrates for Different Concentrations of Adhesion Promoter Similar to Examples 6 and 7 a dielectric substrate was treated with amino functionalized silica nanoparticles (sample 2 of Example 2) in different concentrations (see Table 16). The dielectric substrate was made of ABF-GX 92 from Ajinomoto. The substrates were treated as outlined in Example 10 for sample 4.

One group of substrates was treated with the functionalized silica nanoparticles only (steps 1 to 5 of Example 10); no metallization was performed. This group of samples was subjected to FESEM analysis.

Another group of substrates was additionally metallized as outlined in Example 10 for sample 4. Step 9 of the experimental sequence was changed to:
9. E-less copper bath (Atotech Printoganth MV Plus): 35° C.; 15 min; about 1 µm.

This group of samples was subjected to measurement of adhesion strength by the peeling machine.

Figure 7:
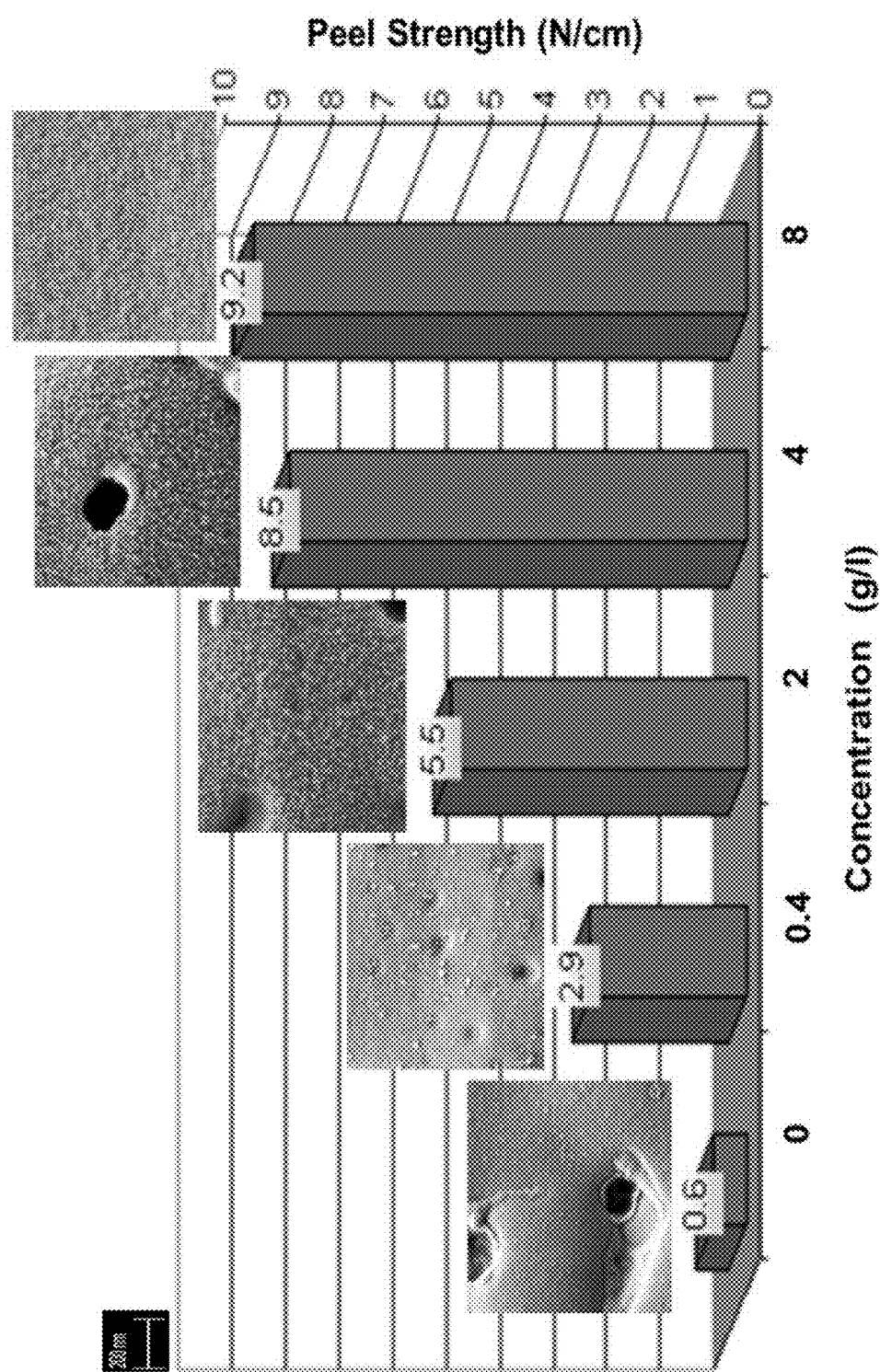
FIG. 7 shows the adhesion strength (peel strength) of metal layers deposited on substrates treated with different concentrations of functionalized silica nanoparticles prior to metallizing. The figure further shows the structure of layers of different concentrations of the functionalized silica nanoparticles applied to a substrate (without metal layer). The pictures of the structures are FESEM images that show a section of the substrates with dimensions of 0.9 μm×0.8 μm.

FESEM Analysis: The structure of the resulting layers of amino functionalized silica nanoparticles on the substrate was analysed by Field Emission Scanning Electron Microscopy (FESEM). FESEM is a type of electron microscopy that produces images of a sample by scanning it with a focused beam of electrons which is well known to persons skilled in the art. The Field Emission Scanning Electron Microscope used was a Zeiss Supra from Carl Zeiss. The surface structures of layers of amino functionalized silica nanoparticles applied in different concentrations to the substrate are presented in FIG. 7.

Adhesion Strength: The adhesion strength of the deposited copper layer was determined as described in Example 13 and the results are summarized in table 16.

Results:

TABLE 16

Adhesion strength (peel strength) for different concentrations of applied amino functionalized silica particles.

| Sample | Adhesion promoter (g/l) | Peel Strength (N/cm) |
|---|---|---|
| 1 | 0 | 0.6 |
| 2 | 0.4 | 2.9 |
| 3 | 2 | 5.5 |
| 4 | 4 | 8.5 |
| 5 | 8 | 9.2 |

The invention claimed is:

1. Method for plating a metal onto a substrate comprising the steps of
  i. contacting the substrate with a solution containing nanometer-sized particles having at least one attachment group bearing a functional chemical group suitable for binding to the substrate, and forming a layer of said nanometer-sized particles bound to at least a portion of a surface of the substrate; and thereafter
  ii. metal plating the substrate by applying a wet-chemical plating method,
  and wherein the layer of said nanometer-sized particles remain between the substrate surface and the plated metal,
  wherein the at least one attachment group has the general Formula (I)

-B-L-FG                                              (I), wherein B is a binding group, L is a linking group and FG is the functional chemical group, and
  wherein the binding group B represents
  a. —Si($R^1R^2$)—, wherein $R^1$ and $R^2$ independently of each other represent alkoxy groups having from 1 to 12 carbon atoms, alkyl groups having from 1 to 12 carbon atoms, halogen atoms and a bond to oxygen atoms originating from the nanometer-sized particle and/or further attachment groups; or
  b. —$CH_2$—$R^3$—, —CO—NH—, —CO—O—, unsubstituted or substituted aryl, wherein $R^3$ represents —CHOH—$CH_2$—O—, —CHOH—$CH_2$—; a linear unsubstituted or substituted hydrocarbon group having from 1 to 5 carbon atoms.

2. Method according to claim 1 wherein the linking group L represents a linear, unsubstituted or substituted hydrocarbon group having from 1 to 20 carbon atoms; a cyclic, unsubstituted or substituted hydrocarbon group having from 3 to 8 carbon atoms; a linear or cyclic hydrocarbon group interrupted by one or more oxygen atoms and/or amino groups; the linear or cyclic hydrocarbon group having one or more double or triple bonds; unsubstituted or substituted aryl or heteroaryl, phosphonates and bipyridyl.

3. Method according to claim 1 wherein the functional chemical group FG represents an amino, carbonyl, carboxyl, ester, epoxy, mercapto, hydroxyl, acrylic, methacrylic, anhydride, acid halide, halogen, allyl, vinyl, styrene, aryl, acetylene, azide, ureido group; 5 to 6 membered heterocyclic hydrocarbon groups containing from 1 to 3 nitrogen atoms; isonicotinamidyl, bipyridyl, nitrile, isonitrile and thiocyanate.

4. Method according to claim 1 wherein the nanometer-sized particles comprise at least one material.

5. Method according to claim 4 wherein the material is selected from an inorganic oxide, an organic polymer and a metal.

6. Method according to claim 5 wherein the inorganic oxide is selected from one or more of silica, alumina, titania, zirconia, tin oxide, zinc oxide, silica gel, silicon oxide-coated $TiO_2$, Sb—$SnO_2$, $Fe_2O_3$, magnetite, IndiumTinOxide (ITO), antimony-doped tin oxide (ATO), indium oxide, antimony oxide, fluorine-doped tin oxide, phosphorous-doped tin oxide, zinc antimonite and indium doped zinc oxide.

7. Method according to claim 4 wherein the nanometer-sized particles have an outer surface which comprises the inorganic oxide.

8. Method according to claim 1 wherein the contacting with the solution in step i. is for a time of 1-20 minutes at a temperature of between 15-80° C.

9. Method according to claim 1 wherein the nanometer-sized particles according to method step i. are in a concentration ranging from 0.5 g/l to 100.0 g/l.

10. Method according to claim 1 wherein a further method step is performed after method step i.:
   ia. heating the substrate to a temperature ranging from 60 and 400° C. for a time period of 1-60 minutes.

11. Method according to claim 1 wherein the nanometer-sized particles have a mean diameter, $d_{50}$, of between 0.5-500 nm.

12. Method according to claim 1 wherein the attachment group suitable for binding to the substrate is attached to the outer surface of nanometer-sized particles.

13. Method according to claim 1 wherein the plated metal remains on the layer of said nanometer-sized particles.

14. Method according to claim 1 wherein the wet chemical plating method is an electrolytic plating method, an immersion plating process or an electroless plating method.

15. Method according to claim 1 wherein the substrate is a non-conductive or semiconducting substrate and the step
   ii. metal plate the substrate applying a wet-chemical plating method;
   comprises:
   iia. contacting the substrate with a noble metal colloid or a noble metal ion containing solution;
   iib. contacting the substrate with an electroless metal plating solution; and
   iic. contacting the substrate with an electrolytic metal plating solution.

16. Method according to claim 1 wherein the substrate is a non-conductive or semiconducting substrate and wherein the following further method steps are performed prior to step i.:
   ic. bringing the substrate into contact with a water-soluble polymer;
   id. treating the substrate with a permanganate solution;
   ie. treating the substrate with an acidic aqueous solution or an acidic microemulsion of aqueous base containing at least one thiophene compound and at least one alkane sulfonic acid selected from the group comprising methane sulfonic acid, ethane sulfonic acid and ethane disulfonic acid;
   and the step
   ii. metal plate the substrate applying a wet-chemical plating method;
   comprises:
   iig. contacting the substrate with an electrolytic metal plating solution.

17. Method according to claim 5 wherein the nanometer-sized particles have an outer surface which comprises the inorganic oxide.

18. Method according to claim 6 wherein the nanometer-sized particles have an outer surface which comprises the inorganic oxide.

19. Method according to claim 1 wherein an outer surface of the nanometer-sized particles comprises a reactive oxygen atom.

20. Method according to claim 2 wherein an outer surface of the nanometer-sized particles comprises a reactive oxygen atom.

21. Method according to claim 3 wherein an outer surface of the nanometer-sized particles comprises a reactive oxygen atom.

22. Method of plating a metal onto a substrate comprising the steps of
   i. contacting the substrate with a solution containing nanometer-sized particles having at least one attachment group bearing a functional chemical group suitable for binding to the substrate, and forming a layer of said nanometer-sized particles bound to at least a portion of a surface of the substrate; and thereafter
   ii. metal plating the substrate by applying a wet-chemical plating method,
   and wherein the layer of said nanometer-sized particles remain between the substrate surface and the plated metal,
   wherein the at least one attachment group has the general Formula (I)

$$\text{-B-L-FG} \qquad (I),$$

wherein B is a binding group, L is a linking group and FG is the functional chemical group, and
   wherein the binding group B represents
   a. —Si($R^1R^2$)—, wherein $R^1$ and $R^2$ independently of each other represent alkoxy groups having from 1 to 12 carbon atoms, alkyl groups having from 1 to 12 carbon atoms, halogen atoms and a bond to oxygen atoms originating from the nanometer-sized particle and/or further attachment groups; or
   b. —$CH_2$—$R^3$—, —CO—NH—, unsubstituted or substituted aryl, wherein $R^3$ represents —CHOH—$CH_2$—O—, —CHOH—$CH_2$—; a linear unsubstituted or substituted hydrocarbon group having from 1 to 5 carbon atoms.

* * * * *